(12) United States Patent
Hubert et al.

(10) Patent No.: US 11,581,351 B2
(45) Date of Patent: Feb. 14, 2023

(54) HYBRID SENSOR SHIFT PLATFORM

(71) Applicant: Apple Inc., Cupertino, CA (US)

(72) Inventors: Aurelien R. Hubert, Saratoga, CA (US); Jee Tung Tan, Singapore (SG); Steven Webster, Singapore (SG); Douglas S. Brodie, Los Gatos, CA (US); Qiang Yang, Fremont, CA (US); Masahito Morita, Kanagawa-ken (JP)

(73) Assignee: Apple Inc., Cupertino, CA (US)

( * ) Notice: Subject to any disclaimer, the term of this patent is extended or adjusted under 35 U.S.C. 154(b) by 388 days.

(21) Appl. No.: 16/935,094

(22) Filed: Jul. 21, 2020

(65) Prior Publication Data

US 2021/0028216 A1    Jan. 28, 2021

Related U.S. Application Data

(60) Provisional application No. 62/878,710, filed on Jul. 25, 2019.

(51) Int. Cl.
| | |
|---|---|
| *H01L 27/146* | (2006.01) |
| *H04N 5/225* | (2006.01) |
| *H04M 1/02* | (2006.01) |

(52) U.S. Cl.
CPC .. *H01L 27/14629* (2013.01); *H01L 27/14627* (2013.01); *H04M 1/0264* (2013.01); *H04N 5/2253* (2013.01); *H04N 5/2254* (2013.01); *H04N 5/22521* (2018.08)

(58) Field of Classification Search
CPC ......... H01L 27/14629; H01L 27/14627; H01L 27/14618; H04M 1/0264; H04N 5/22521; H04N 5/2253; H04N 5/2254; H04N 5/2257; H04N 5/23287; G02B 27/646; G02B 7/08

See application file for complete search history.

(56) References Cited

U.S. PATENT DOCUMENTS

| | | |
|---|---|---|
| 9,088,705 B1 | 7/2015 | Tam |
| 9,477,139 B2 | 10/2016 | McKinley |
| 9,641,733 B1 | 5/2017 | Topliss et al. |

(Continued)

FOREIGN PATENT DOCUMENTS

| | | |
|---|---|---|
| CN | 105025657 | 11/2015 |

OTHER PUBLICATIONS

International Search Report and Written Opinion from PCT/2020/043595, dated Nov. 30, 2020, pp. 1-15.

*Primary Examiner* — John P. Dulka
(74) *Attorney, Agent, or Firm* — Robert C. Kowert; Kowert, Hood, Munyon, Rankin & Goetzel, P.C.

(57) ABSTRACT

A hybrid sensor shift platform for an optical image stabilization (OIS) actuator mechanism in compact camera modules includes two or more substrates. A top substrate is composed of an organic material (e.g., a resin) to reduce mass, reduce magnetic interaction with permanent magnets, and improve reliability. One or more lower substrates of the hybrid sensor shift platform are ceramic substrates that provide the benefits of ceramics for connection to the image sensor. The organic substrate is connected via a solder bond process to the lower ceramic substrate(s). The connection between the substrates is reinforced with an under-fill of epoxy that surrounds the solder bonds, thus creating a full interface between the substrates within the overlap.

22 Claims, 13 Drawing Sheets

(56) References Cited

U.S. PATENT DOCUMENTS

| | | | |
|---|---|---|---|
| 2006/0097370 A1* | 5/2006 | Bartley | H01L 23/49838 257/E23.07 |
| 2010/0200898 A1* | 8/2010 | Lin | H01L 27/14632 257/E31.11 |
| 2010/0328526 A1* | 12/2010 | Halliday | H01L 27/14683 348/E5.025 |
| 2011/0044367 A1* | 2/2011 | Budd | H01L 27/1446 257/E31.127 |
| 2013/0039640 A1 | 2/2013 | Sekimoto | |
| 2018/0171991 A1 | 6/2018 | Miller et al. | |
| 2019/0020822 A1 | 1/2019 | Sharma et al. | |

* cited by examiner

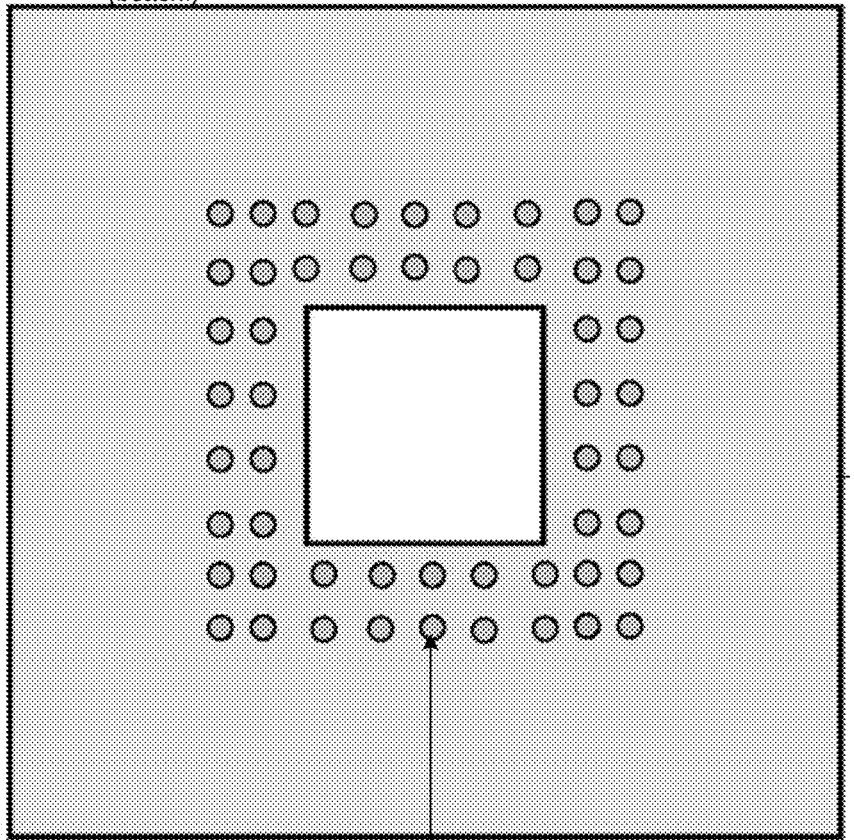
*FIG. 5A*
Contact points
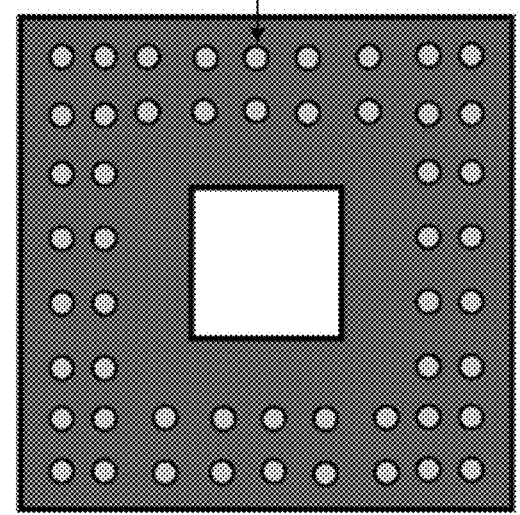
Ceramic substrate 532A (top)
*FIG. 5B*
*FIG. 5C*

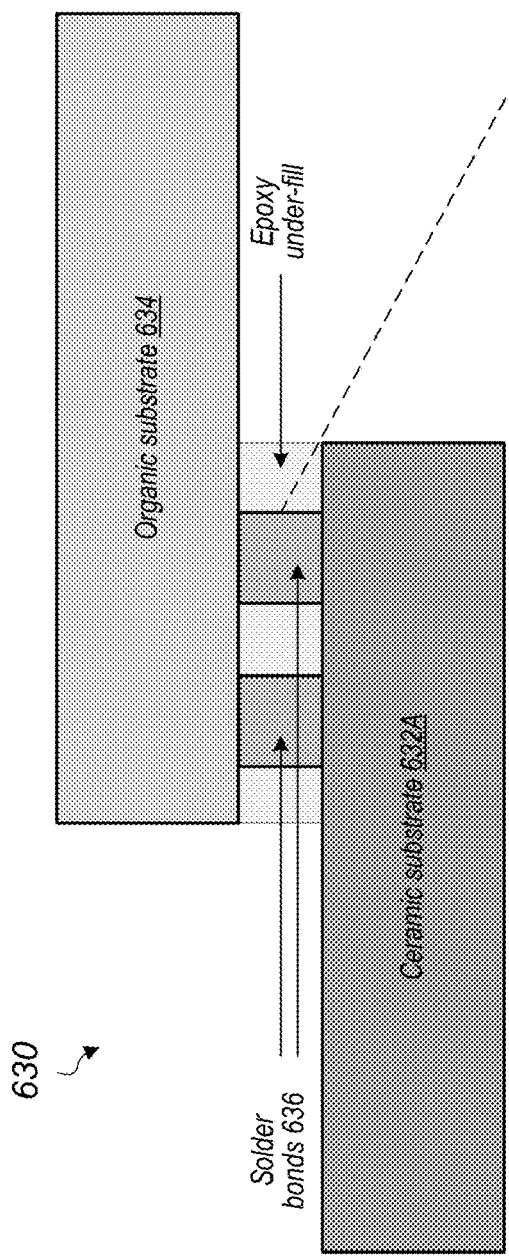
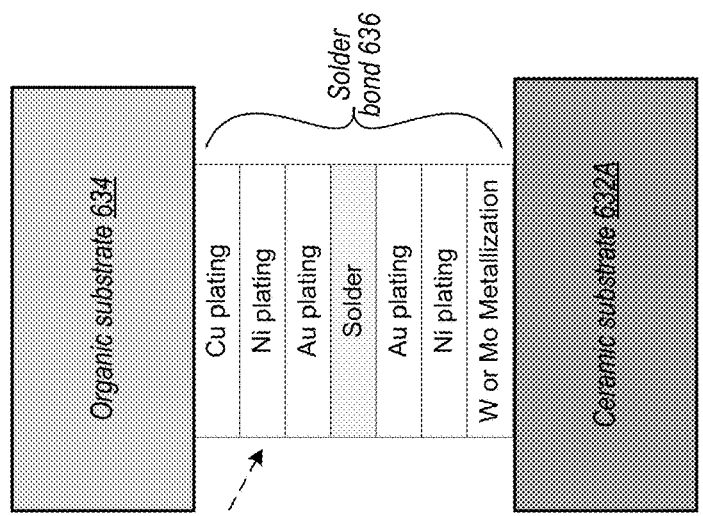
FIG. 6A
FIG. 6B

HYBRID SENSOR SHIFT PLATFORM

PRIORITY INFORMATION

This application claims benefit of priority of U.S. Provisional Application Ser. No. 62/878,710 entitled "HYBRID SENSOR SHIFT PLATFORM" filed Jul. 25, 2019, the content of which is incorporated by reference herein in its entirety.

BACKGROUND

The advent of small, mobile multipurpose devices such as smartphones and tablet or pad devices has resulted in a need for high-resolution, small form factor cameras for integration in the devices. Some small form factor cameras may incorporate optical image stabilization (OIS) mechanisms that may sense and react to external excitation/disturbance by adjusting location of the optical lens on the X and/or Y axis in an attempt to compensate for unwanted motion of the lens. Some small form factor cameras may incorporate an autofocus (AF) mechanism whereby the object focal distance can be adjusted to focus an object plane in front of the camera at an image plane to be captured by the image sensor. In some such autofocus mechanisms, the optical lens is moved as a single rigid body along the optical axis (referred to as the Z axis) of the camera to refocus the camera.

In addition, high image quality is easier to achieve in small form factor cameras if lens motion along the optical axis is accompanied by minimal parasitic motion in the other degrees of freedom, for example on the X and Y axes orthogonal to the optical (Z) axis of the camera. Thus, some small form factor cameras that include autofocus mechanisms may also incorporate optical image stabilization (OIS) mechanisms that may sense and react to external excitation/disturbance by adjusting location of the optical lens on the X and/or Y axis in an attempt to compensate for unwanted motion of the lens.

SUMMARY OF EMBODIMENTS

Various embodiments of a hybrid platform for an optical image stabilization (OIS) actuator mechanism in compact camera modules are described. An OIS actuator mechanism includes a sensor shift platform moveably mounted to a static platform. The sensor shift platform may be composed of two or more substrates. Instead of using ceramic material for all of the substrates of the sensor shift platform, at least one substrate of the sensor shift platform (a top substrate, which is the largest substrate and closest to the permanent magnets) is composed of an organic material (e.g., a resin). One or more lower substrates of the hybrid sensor shift platform are ceramic substrates that provide the benefits of ceramics for connection to the image sensor (e.g., stiffness and rigidity and gold bump attachments to the image sensor). The organic substrate is connected via a solder bond process to the lower ceramic substrate(s) with a specific pad definition/arrangement. To take stress off the solder bonds between the organic substrate and the ceramic substrate, the connection between the substrates is reinforced with an under-fill of epoxy that surrounds the solder bonds, thus creating a full interface between the substrates within the overlap.

Using an organic substrate as the top substrate of the sensor shift platform reduces mass of the hybrid sensor shift platform. The top substrate of the sensor shift platform is the largest substrate, closest substrate to the VCM magnets, and holds sensor positioning (SP) coils, SP sensors, and various other electrical components. Since the mass of the hybrid sensor shift platform is significantly reduced by using an organic material for the top substrate, the magnetic force and thus the power required to move the sensor shift platform and the thermal heat generated is significantly reduced when compared to a ceramic sensor shift platform.

Instead of using an electrolytic nickel plating process as is used for the ceramic substrate(s), an electroless nickel plating process is used for the organic substrate of the hybrid sensor shift platform. An electroless nickel plating process does not magnetize the nickel plating as does the electrolytic nickel plating process used for the ceramic substrate(s). The organic substrate is the top substrate of the hybrid sensor shift platform and thus closest to the VCM magnets. Thus, magnetic attraction between the hybrid sensor shift platform and the VCM magnets is significantly reduced when compared to a ceramic sensor shift platform.

The organic substrate is the top substrate of the hybrid sensor shift platform and thus closest to other components of the camera module that may contact the substrate during a drop event. The organic material used for the top substrate of the hybrid sensor shift platform is more resilient and flexible than ceramic material, and thus less prone to fracture. Thus, the hybrid sensor shift platform may be more reliable and less prone to fracture in drop events when compared to a ceramic sensor shift platform.

BRIEF DESCRIPTION OF THE DRAWINGS

FIGS. 5A through 5D illustrate a hybrid sensor shift platform composed of an organic block and one or more ceramic blocks, in accordance with some embodiments.

FIGS. 6A and 6B illustrate solder bond connections between an organic block and a ceramic block of a hybrid sensor shift platform, in accordance with some embodiments.

Figure 1:
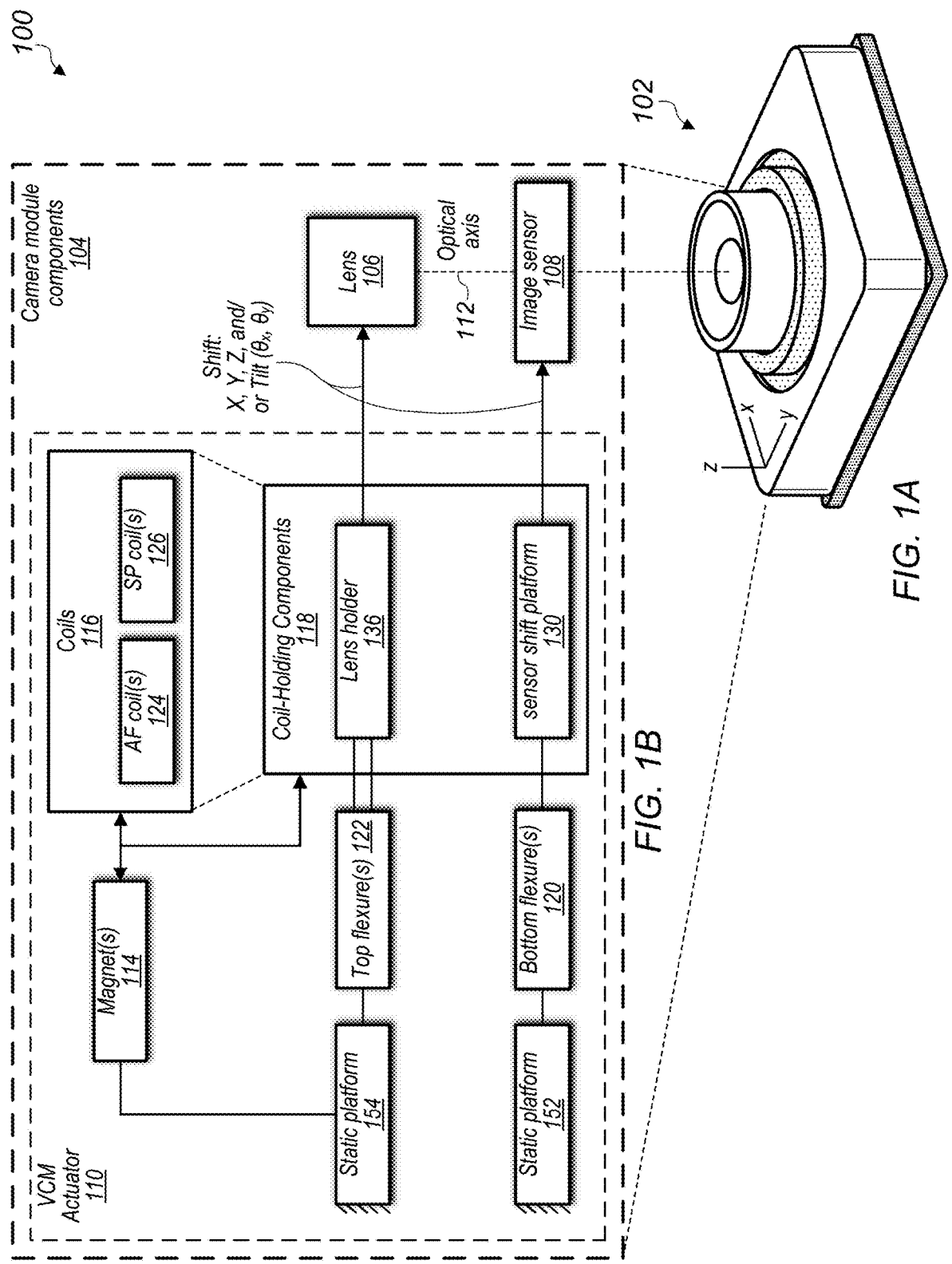
FIGS. 1A and 1B illustrate an example camera module having an actuator module or assembly that may, for example, be used to provide autofocus through lens assembly movement and optical image stabilization through image sensor movement in small form factor cameras, and includes a perspective view of an example exterior of the camera module and a block diagram of example camera module components, in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Various embodiments of a hybrid platform for an optical image stabilization (OIS) actuator mechanism in compact camera modules are described. A compact camera module may include a lens, an image sensor, and one or more actuators to provide functions such as autofocus (AF) and OIS. The image sensor may be configured to capture light passing through the lens and to convert the captured light into image signals. In some embodiments of an OIS actuator mechanism, the image sensor is mounted on a dynamic platform (referred to as a sensor shift platform) which translates in X and Y (as opposed to an AF actuator that translates the lens in Z, where Z is the optical axis of the camera). Mounting of the image sensor (wirebonding, flip/chip, BGA) to the sensor shift platform with run out electrical signal traces from the sensor shift platform to a static platform of the camera module provides for connection to the image sensor. In-plane flexures connect the sensor shift platform to the static platform and support electrical signal traces.

One approach to providing a compact actuator for AF and/or OIS is to use a Voice Coil Motor (VCM) mechanism. In some embodiments, a camera module includes an AF VCM mechanism and an OIS VCM mechanism. In some embodiments, the AF VCM mechanism includes a lens carrier moveably mounted to a static platform, a plurality of shared magnets mounted to the static platform, and an AF coil fixedly mounted to the lens carrier for producing forces for moving the lens carrier in a direction of an optical axis of one or more lenses of the lens carrier to provide AF functionality for the camera.

In some embodiments, the OIS VCM mechanism includes a sensor shift platform moveably mounted to a static platform, and one or more sensor positioning (SP) coils mounted to the sensor shift platform within the magnetic fields of the shared magnets, for producing forces for moving the sensor shift platform in a plurality of directions orthogonal to the optical (Z) axis, for example to provide OIS functionality for the camera. In-plane flexures mechanically connect the sensor shift platform to the static platform and support electrical signal traces that electrically connect the sensor shift platform to the static platform. The flexures may provide compliance for movement of the sensor shift platform in directions orthogonal to the optical axis and along the optical axis.

In some embodiments, a device (e.g., a mobile multifunction device) may include one or more camera modules, a display, and one or more processors. A camera module may include a lens that defines an optical axis, an image sensor, an AF VCM mechanism for moving the lens to provide AF functionality for the camera, and an OIS VCM mechanism to provide OIS functionality for the camera. The image sensor may be configured to capture light passing through the lens and convert the captured light into image signals. The OIS VCM mechanism may include a sensor shift platform coupled to the image sensor such that the image sensor moves together with the sensor shift platform. A flexure may mechanically and electrically connect the sensor shift platform to a static platform of the camera module. In some embodiments, the processors may be configured to cause the OIS VCM mechanism to move the sensor shift platform and thus the image sensor in directions orthogonal to the optical axis of the camera to provide OIS functionality for the camera. In some embodiments, the processors may also be configured to cause the AF VCM mechanism to move the lens along the optical axis of the camera to provide AF functionality for the camera. In some cases, the processors may be configured to cause the display to present an image based at least in part on one or more of the image signals from the image sensor. For instance, the image sensor may be in electrical contact with the sensor shift platform. The flexure may include one or more electrical traces configured to convey the image signals from the sensor shift platform to the static platform. The static platform may be in electrical contact with a flex circuit board of the device such that the static platform conveys the image signals to the flex circuit board. The processors may receive the image signals at least partly via the flex circuit board.

In some embodiments, the sensor shift platform may be composed of two or more substrates. In some embodiments, the substrates may be composed of a ceramic material. Ceramic may be used for the substrates for a number of reasons, for example due to its low coefficient of thermal expansion (CTE) and high mechanical strength that provide a core of the camera module structure that both protects and minimizes stress on the image sensor chip. The image sensor may be connected to the ceramic substrate, for example using a "flip chip" (F/C) process. Flip chip is a method for interconnecting semiconductor devices such as IC chips to external circuitry with solder bumps that have been deposited onto the chip pads. A gold stud bump and gold-to-gold ultrasonic bonding (or, alternatively, gold stud bump and thermo-compression) may be used rather than wafer level gold (or other metal) bumping due to the need to keep the image sensor wafer clean at a sub-micron level to prevent image defects in the camera when functioning. Gold bump to gold bonding works well on gold-plated ceramic due to the ceramic material's mechanical properties.

Since the sensor shift platform is suspended in the camera module to allow the sensor shift platform and thus the image sensor to be moved by the OIS VCM mechanism, there are challenges in using a ceramic material for the substrates of the sensor shift platform, including:

Mass: drives VCM performance and reliability in shock events. The higher the mass of the sensor shift platform, the higher the magnetic force and thus power required to move the sensor shift platform, which also generates more thermal heat.

Magnetism: in fabrication, the ceramic substrates goes through an electrolytic nickel plating process which magnetizes the component, which is an issue in the presence of the nearby permanent VCM magnets.

Reliability in shock events: ceramic materials, though high modulus, are prone to fracture that are highly dependent of the singulation quality on the perimeter of the chip.

To address the challenges stated above, embodiments of a hybrid sensor shift platform are described in which at least one substrate of the sensor shift platform (a top substrate, which is the largest substrate and closest to the permanent magnets) is composed of an organic material (e.g., a resin). One or more lower substrates of the hybrid sensor shift platform are ceramic substrates that provide the benefits of ceramics for connection to the image sensor (e.g., stiffness and rigidity and gold bump attachments to the image sensor). The organic substrate is connected via a solder bond process to the lower ceramic substrate(s) with a specific pad definition/arrangement. To take stress off the solder bonds between the organic substrate and the ceramic substrate, the connection between the substrates is reinforced with an under-fill of epoxy that surrounds the solder bonds, thus creating a full interface between the substrates within the overlap.

Using an organic material (e.g., resin) for the top substrate of the sensor shift platform reduces mass of the hybrid sensor shift platform when compared to a ceramic sensor shift platform, for example by 10-20%. The top substrate of the sensor shift platform is the largest substrate, closest substrate to the VCM magnets, and holds sensor positioning (SP) coils, SP sensors, and various other electrical component). Since the mass of the hybrid sensor shift platform is significantly reduced by using an organic material for the top substrate, the magnetic force and thus the power required to move the sensor shift platform and the thermal heat generated is significantly reduced when compared to a ceramic sensor shift platform.

Instead of using an electrolytic nickel plating process as is used for the ceramic substrate(s), an electroless nickel plating process is used for the organic substrate of the hybrid sensor shift platform. An electroless nickel plating process does not magnetize the nickel plating as does the electrolytic nickel plating process used for the ceramic substrate(s). The organic substrate is the top substrate of the hybrid sensor shift platform and thus closest to the permanent VCM magnets. Thus, magnetic attraction between the hybrid sensor shift platform and the VCM magnets is significantly reduced when compared to a ceramic sensor shift platform (e.g., by 90-95%).

The organic substrate is the top substrate of the hybrid sensor shift platform and thus closest to other components of the camera module that may contact the platform during a drop event. The organic material used for the top substrate of the hybrid sensor shift platform is more resilient and flexible than ceramic material, and thus less prone to fracture. Thus, the hybrid sensor shift platform may be more reliable and less prone to fracture in drop events when compared to a ceramic sensor shift platform.

The sensor shift platform requires a large top substrate to provide enough surface area and signal routing area for the module. Such a large area of ceramic would reduce the number of parts per assembly panel compared to smaller designs, which would significantly increase the cost of manufacture. In some embodiments, to manufacture the ceramic substrates, layers of ceramic are built on a machine. A carrier is to support all those parts. The carrier has a specific size, and can hold a number of parts per carrier. The carrier goes into a machine which has a defined size. Increasing the size of the ceramic blocks being reduces the number of parts per carrier for the same machine. Reducing the number of parts per carrier increases the cost of manufacture.

Thus, embodiments of the hybrid sensor shift platform reduce the weight of the substrate, reduce unwanted magnetic interaction between the substrate and the VCM magnets, make the substrate more reliable, and reduce cost of manufacture, while still meeting the overall requirements of the sensor shift platform.

FIGS. 1A and 1B illustrates an example camera module 100 that includes a voice coil motor (VCM) actuator for shifting a lens and/or an image sensor along multiple axes, in accordance with some embodiments. FIG. 1A provides a perspective view of an example exterior 102 of the camera module 100 and FIG. 1B provides a block diagram of example components 104 of the camera module 100. In some embodiments, the camera module 100 may include one or multiple features, components, and/or functionality of embodiments described herein.

In some embodiments, the camera module components 104 may include a lens 106, an image sensor 108, and a VCM actuator 110. The lens 106 may define an optical axis 112. The image sensor 108 may be configured to capture light passing through the lens 106 and convert the captured light into image signals. In various embodiments, the VCM actuator 110 may include magnets 114, coils 116, coil-holding components 118, one or more bottom flexures 120, and one or more top flexures 122.

The magnets 114 and the coils 116 may be configured to magnetically interact, e.g., to produce Lorentz forces that cause one or more of the coil holding components 118 to shift along multiple axes. For instance, a coil holding component 118 may move in directions orthogonal to the optical axis 112 (e.g., along the X-Y plane). Additionally, or alternatively, a coil holding component 118 may move along the optical axis (e.g., along the Z axis). Additionally, or alternatively, a coil holding component 118 may tilt relative to the optical axis (e.g., along the X- and Y-axes). In various examples, the lens 106 and the image sensor 108 may be configured to shift together with, and in a similar or same manner as, respective coil holding components 118.

The coils 116 may include autofocus (AF) coils 124 and sensor positioning (SP) coils 126. In some embodiments, the coil holding components 118 may include the sensor shift platform 130 and a lens holder 136. For instance, the sensor shift platform 130 may be configured to hold at least one sensor positioning (SP) coil 126, and the lens holder 136 may be configured to hold at least one autofocus coil 124. The sensor shift platform 130 may be coupled to the image sensor 108 such that the image sensor 108 shifts together with the sensor shift platform 130. Furthermore, the lens holder 136 may be coupled to the lens 106 such that the lens 106 shifts together with the lens holder 136.

The bottom flexures 120 may be configured to mechanically connect the sensor shift platform 130 to the static platform 152. The bottom flexures 120 may also be configured to provide compliance for movement of the sensor shift platform 130. Furthermore, the bottom flexures 120 may be configured to support, at least in part, the sensor shift platform 130. For example, the sensor shift platform 130 may be suspended from the bottom flexures 120.

The top flexures 122 may be configured to mechanically connect the lens holder 136 to the static platform 154. The top flexures 122 may also be configured to provide compliance for movement of the lens holder 136. Furthermore, the top flexures 122 may be configured to support, at least in part, the lens holder 136. For example, the lens holder 136 may be suspended from the top flexures 122.

The AF coil(s) 124 may receive a current and magnetically interact with the magnet(s) 114 to produce forces that cause the lens holder 136 to shift. For instance, interaction between the AF coil(s) 124 and the magnet(s) 114 may produce forces that cause the lens holder 136 to move along the optical axis 112 and/or to tilt relative to the optical axis 112. The lens 106 may shift together with, and in a similar or same manner as, the lens holder 136.

Furthermore, the SP coil(s) 126 may receive a current and magnetically interact with the magnet(s) 114 to produce forces that cause the sensor shift platform 130 to shift. For instance, interaction between the SP coil(s) 126 and the magnet(s) 114 may produce forces that cause the sensor shift platform 130 to move in directions orthogonal to the optical axis 112. The image sensor 108 may shift together with, and in a similar or same manner as, the sensor shift platform 130.

Figure 2:
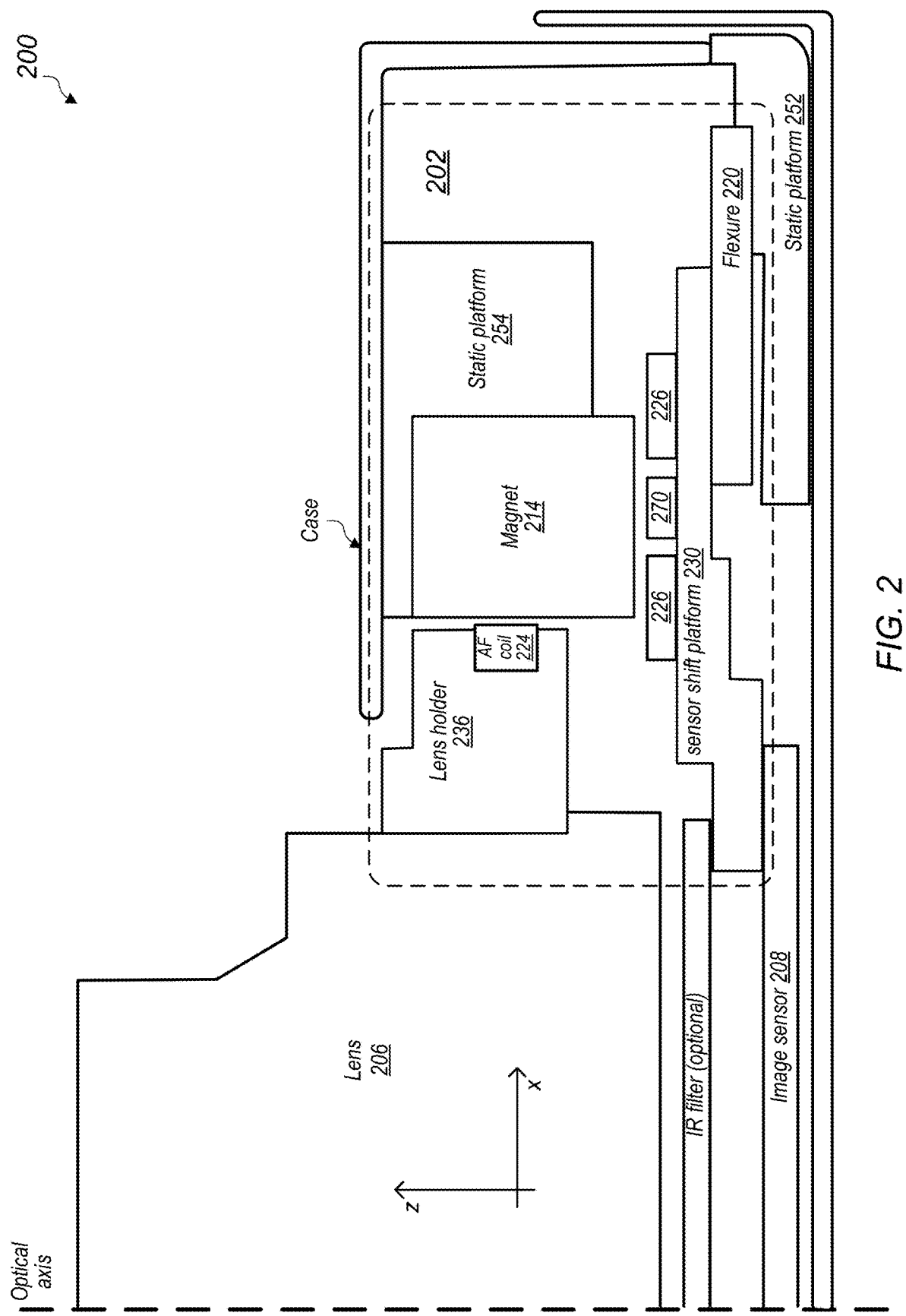
FIG. 2 is a cross-sectional view of an example camera module that includes an image sensor coupled to a sensor shift platform and an actuator mechanism for shifting the sensor shift platform along multiple axes, in accordance with some embodiments.

FIG. 2 is a cross-sectional view of an example camera module 200 that includes an image sensor coupled to a sensor shift platform and a voice coil motor (VCM) actuator mechanism for shifting the sensor shift platform along multiple axes, in accordance with some embodiments. In some embodiments, the camera module 200 may include a lens 206, an image sensor 208, and a VCM actuator module 202. The lens 206 may define an optical axis. The image sensor 208 may be configured to capture light passing through the lens 206 and convert the captured light into image signals. In some cases, the VCM actuator module 202 may be one of multiple VCM actuator modules of the camera module 200. For instance, the camera module 200 may include four such VCM actuator modules 202, such as two pairs of VCM actuator modules 202 that oppose one another relative to the lens 206. The VCM actuator module(s) 202 may be configured to move the lens 206 along the optical axis (e.g., to provide autofocus (AF) functionality) and/or tilt the lens 206 relative to the optical axis. Furthermore, the VCM actuator module(s) 202 may be configured to move the image sensor 208 in directions orthogonal to the optical axis (e.g., to provide optical image stabilization (OIS) functionality).

In various embodiments, the VCM actuator module 202 may include a magnet 214 (e.g., a stationary single pole magnet, a lens holder 236, a sensor shift platform 230, a top flexure (not shown), and a bottom flexure 220. Furthermore, the VCM actuator module 202 may include an autofocus coil 224 and a bottom sensor positioning (SP) coil 226.

In some embodiments, the lens holder 236 may hold, or otherwise support, the AF coil 224 proximate a side of the magnet 214. The lens holder 236 may be coupled to the lens 206 such that the lens 206 shifts together with the lens holder 236.

In some embodiments, the sensor shift platform 230 may hold, or otherwise support, the bottom SP coil 226 proximate a bottom side of the magnet 214. The sensor shift platform 230 may be coupled to the image sensor 208 such that the image sensor 208 shifts together with the sensor shift platform 230. In some embodiments, the sensor shift platform 230 may also hold an infrared (IR) filter.

In some embodiments, the VCM actuator module 202 may include a position sensor 270 (e.g., a Hall sensor) for position detection based on movement of the SP coil 226 in directions orthogonal to the optical axis. For example, the position sensor 270 may be located on the sensor shift platform 230 proximate to the SP coil 226.

The bottom flexure 220 may be configured to mechanically and electrically connect the sensor shift platform 230 to a static platform 252 of the VCM actuator module(s) 202 and/or of the camera module 200. The bottom flexure 220 may also be configured to provide compliance for movement of the sensor shift platform 230 in directions orthogonal to the optical axis. Furthermore, the bottom flexure 220 may be configured to support, at least in part, the sensor shift platform 230.

The top flexure (not shown) may be configured to mechanically and electrically connect the lens holder 236 to the case and/or to static platform 254. The top flexure may be configured to provide compliance for movement of the lens holder 236 along the optical axis and for tilt of the lens holder 236 relative to the optical axis. The case may encompass, at least in part, an interior of the camera module 200. The case may be a static member that is static relative to one or more moving components (e.g., the lens holder 236 and sensor shift platform 230).

In some embodiments, the stationary magnet 214 may be fixed to a static platform 254. In some examples, each of the AF coil 224 and the SP coil 226 may be a race track coil. In some embodiments, the SP coil 226 may be an SP coil module that attached to the top of the sensor shift platform

230. Alternatively, in some embodiments, the SP coil 226 may be a flat race track coil that is etched on the sensor shift platform 230.

Interaction between the AF coil 224 and the magnet 214 may produce forces that cause the lens holder 236 to move along the optical axis and/or to tilt relative to the optical axis. Interaction between the magnet 214 and the SP coil 226 may produce forces that cause the sensor shift platform 230 to move in directions orthogonal to the optical axis. The lens 206 may shift together with, and in a similar or same manner as, the lens holder 236. Furthermore, the image sensor 208 may shift together with, and in a similar or same manner as, the sensor shift platform 230.

In various embodiments, electrical contacts/connections may allow for image signals to be conveyed from the image sensor 208 to a controller comprising one or more processors (not shown). For instance, the image sensor 208 may be in electrical contact with the sensor shift platform 230 via one or more contacts, and thus the image signals may be conveyed from the image sensor 208 to the sensor shift platform 230. The image signals may be conveyed from the sensor shift platform 230 to the static platform 252 via the bottom flexure 220. For instance, the bottom flexure 220 may include electrical traces that allow for the image signals to be conveyed from the sensor shift platform 230 to the static platform 252. The static platform 252 may be in electrical contact with the controller (or with a circuit board to which the controller is attached) via one or more contacts or other electrical connections, and thus the image signals may be conveyed from the static platform 252 to the controller.

According to various examples, electrical contacts/connections may allow for current to be conveyed from the controller to the sensor shift platform 230 to drive the SP coil 226. For instance, the controller (or a circuit board to which the controller is attached) may convey the current to the static platform 252. The current may be conveyed from the static platform 252 to the sensor shift platform 230 via the electrical traces of the bottom flexure 220. The sensor shift platform 230 may convey the current to the bottom SP coil 226.

The sensor shift platform 230 is suspended in the camera module 200 to allow the sensor shift platform 230 and thus the image sensor 208 to be moved by the VCM mechanism. Issues that may affect the design and functionality of a sensor shift platform 230 may include, but are not limited to:

The image sensor 208 needs to be kept clean at a sub-micron level to prevent image defects in the camera when functioning.

The sensor shift platform 230 should protect and minimizes stress on the image sensor 208.

Mass: drives VCM performance and reliability in shock events. The mass of the sensor shift platform 230 should be minimized. The higher the mass of the sensor shift platform 230, the higher the magnetic force and thus power required to move the sensor shift platform 230, which also generates more thermal heat.

Magnetism: Since the sensor shift platform 230 is directly below the permanent VCM magnets 214, magnetic attraction of the platform 230 to the magnets 214 should be minimized to reduce unwanted magnetic interaction between the platform 230 and the VCM magnets 214.

Reliability in shock events: the top of the sensor shift platform 230 may be close to other components of the camera module 200 that may contact the platform 230 during a drop event. Thus, at least the top substrate of the platform 230 should be resilient and flexible for reliability.

Figure 3:
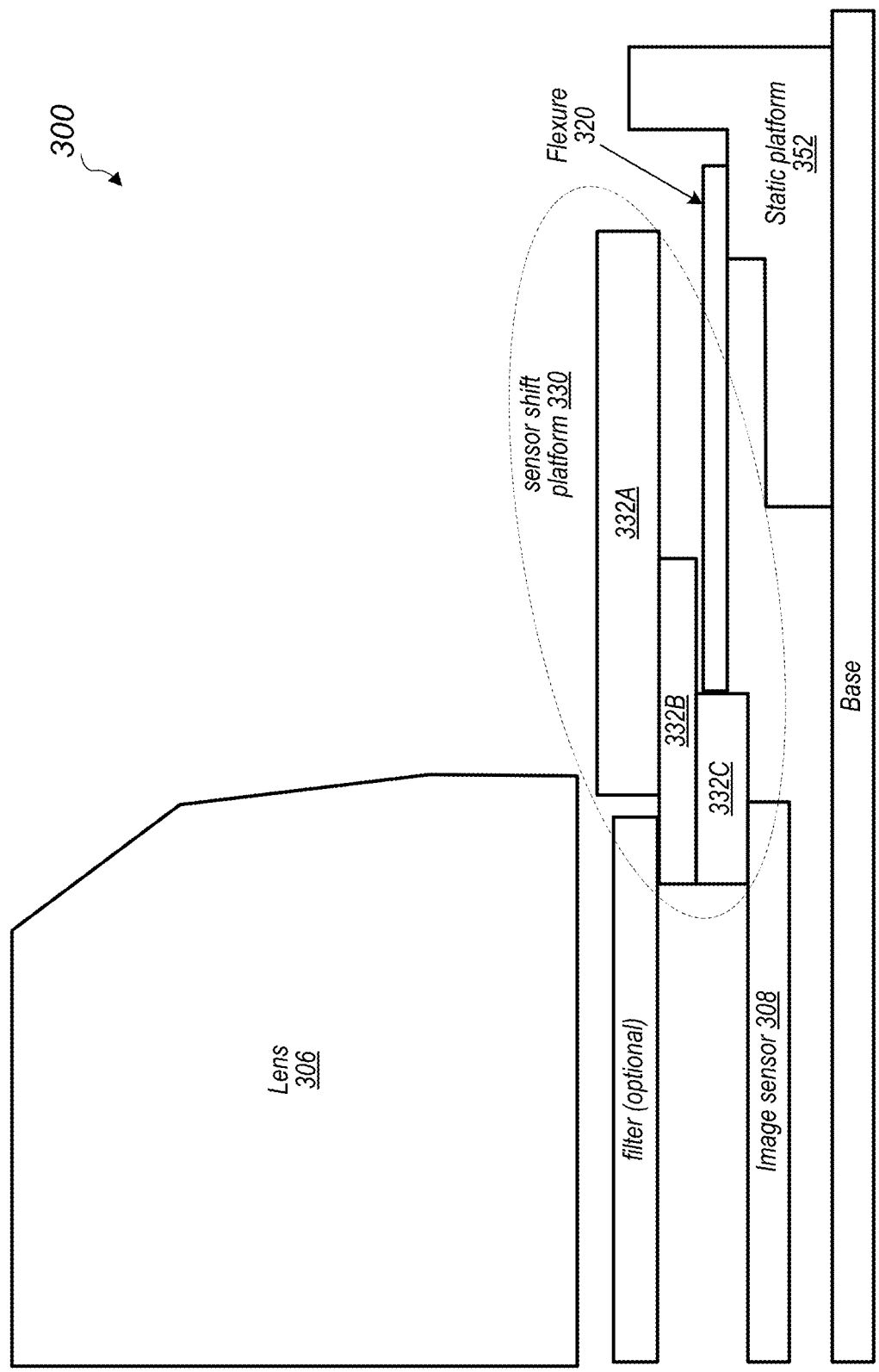
FIG. 3 is a cross-sectional view of an example camera module that includes a sensor shift platform composed of two or more ceramic blocks, in accordance with some embodiments.

FIG. 3 is a cross-sectional view of an example camera module 300 that includes a sensor shift platform 330 composed of two or more ceramic substrates, in accordance with some embodiments. In this example, there are three ceramic substrates 332A, 332B, and 332C. Ceramic may be used for the platform 330 substrates for a number of reasons, for example due to its low coefficient of thermal expansion (CTE) and high mechanical strength to protect and minimize stress on the image sensor 308. A flexure 320 may be configured to mechanically and electrically connect the sensor shift platform 330 to a static platform 352 of the camera module 300. The flexure 320 may also be configured to provide compliance for movement of the sensor shift platform 330 in directions orthogonal to the optical axis. Furthermore, the flexure 320 may be configured to support, at least in part, the sensor shift platform 330. The image sensor 308 may be configured to capture light passing through the lens 306 and convert the captured light into image signals. The image sensor 308 may be connected to a lower ceramic substrate 332C of the sensor shift platform 330, for example using a "flip chip" (F/C) process. Flip chip is a method for interconnecting semiconductor devices such as IC chips to external circuitry with solder bumps that have been deposited onto the chip pads. A gold stud bump and gold-to-gold ultrasonic bonding (or, alternatively, gold stud bump and thermo-compression) may be used rather than wafer level gold (or other metal) bumping due to the need to keep the image sensor 308 clean at a sub-micron level to prevent image defects in the camera when functioning. Gold bump to gold bonding works well on gold-plated ceramic due to the ceramic material's mechanical properties. However, this process does not work well on organic laminate substrates as the materials (e.g., resins) are too soft and may collapse during the process, creating weak or failed bonds. Weak bonds tend to fail in reliability stress testing.

Using ceramic in the sensor shift platform 330 helps to keep the image sensor 308 clean at a sub-micron level, and protects and minimizes stress on the image sensor 308. However, ceramic is relatively heavy when compared to organic materials (e.g., resins). The higher the mass of the sensor shift platform, the higher the magnetic force and thus power required to move the sensor shift platform, which also generates more thermal heat. In addition, in fabrication, the ceramic substrates goes through an electrolytic nickel plating process which magnetizes the component, which is an issue in the presence of the nearby permanent VCM magnets. Further, ceramic, though high modulus, is prone to fracture that are highly dependent of the singulation quality on the perimeter of the chip.

Figures 4A, 4B:
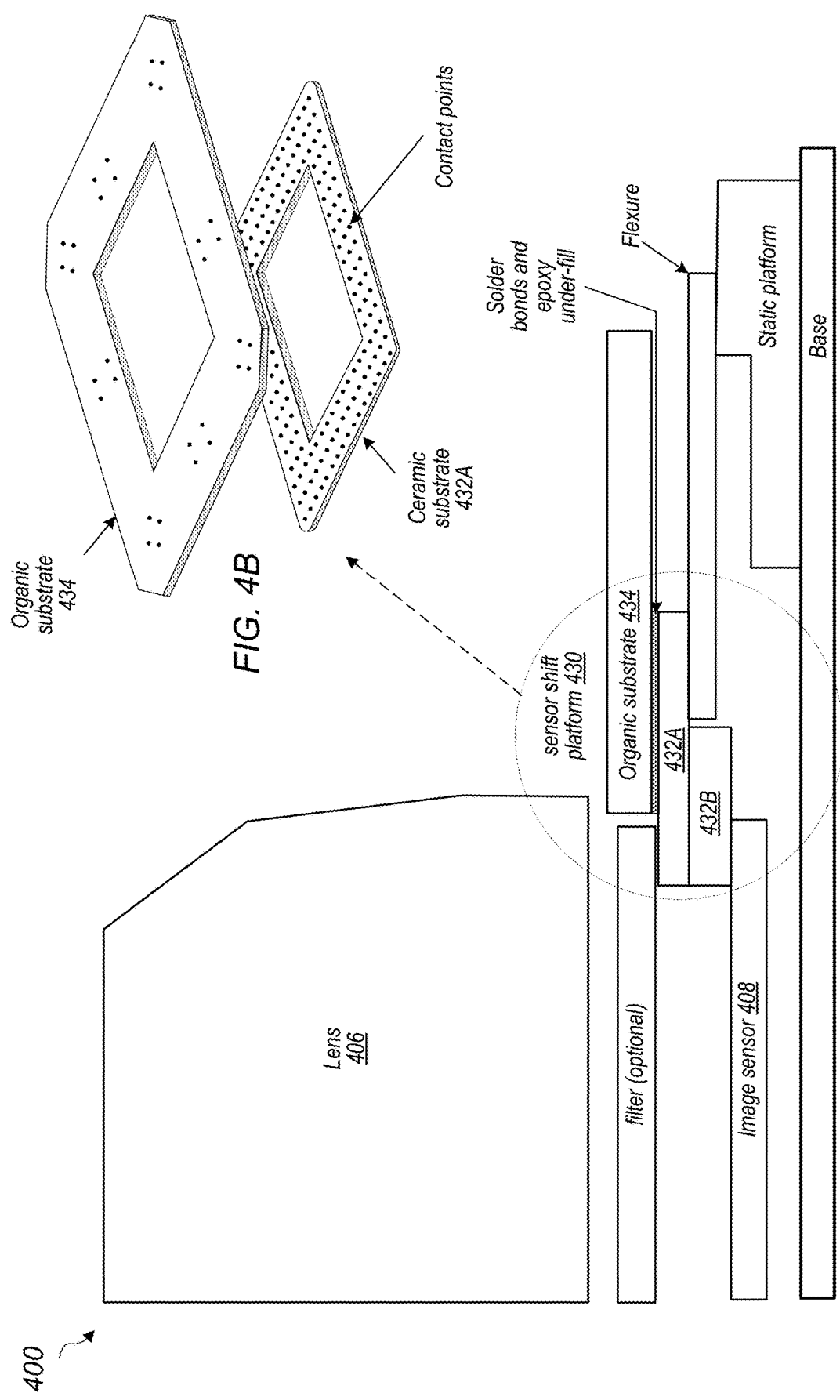
FIG. 4A is a cross-sectional view of an example camera module that includes a hybrid sensor shift platform composed of an organic block and one or more ceramic blocks, in accordance with some embodiments.
FIG. 4B shows a three-dimensional perspective view of an example organic substrate and ceramic substrate of an example hybrid sensor shift platform, in accordance with some embodiments.

FIG. 4A is a cross-sectional view of an example camera module 400 that includes a hybrid sensor shift platform 430 composed of an organic substrate 434 and one or more ceramic substrates 432, in accordance with some embodiments. In this example, there is one organic substrate 434 and two ceramic substrates 432A and 432B. To address the shortcomings of a ceramic platform 330 as illustrated in FIG. 3 while still meeting the overall requirements of the sensor shift platform, the top substrate 434 of the platform 430, which is the largest substrate and closest to the permanent magnets, is composed of an organic material (e.g., a resin). Image sensor 408 may be configured to capture light passing through the lens 406 and convert the captured light into image signals. The lower substrates 432A and 432B are ceramic to provide the benefits of ceramics for connection to the image sensor 408 (e.g., stiffness and rigidity and gold bump attachments to the image sensor 408). The organic substrate 434 is connected via a solder bond process to the lower ceramic substrate 432A with a specific pad definition/ arrangement. To take stress off the solder bonds between the organic substrate 434 and the ceramic substrate 432A, the connection between substrates 434 and 432A is reinforced with an under-fill of epoxy that surrounds the solder bonds, thus creating a full interface between the substrates within the overlap.

Using an organic material (e.g., resin) for the top substrate 434 of the sensor shift platform 430 reduces mass of the hybrid sensor shift platform 430 when compared to a ceramic sensor shift platform 330, for example by 10-20%. The top substrate 434 of the sensor shift platform 430 is the largest substrate, closest substrate to the VCM magnets, and holds sensor positioning (SP) coils, SP sensors, and various other electrical components (not shown in FIGS. 4A and 4B). Since the mass of the hybrid sensor shift platform 430 is significantly reduced by using an organic material for the top substrate 434, the magnetic force and thus the power required to move the sensor shift platform 430 and the thermal heat generated is significantly reduced when compared to a ceramic sensor shift platform 330.

Instead of using an electrolytic nickel plating process as is used for the ceramic substrate(s), an electroless nickel plating process is used for the organic substrate 434 of the hybrid sensor shift platform 430. An electroless nickel plating process does not magnetize the nickel plating as does the electrolytic nickel plating process used for the ceramic substrate(s) 432. The organic substrate 434 is the top substrate of the hybrid sensor shift platform and thus closest to the permanent VCM magnets (not shown in FIG. 4). Thus, magnetic attraction between the hybrid sensor shift platform 430 and the VCM magnets is significantly reduced when compared to a ceramic sensor shift platform 330 (e.g., by 90-95%).

The organic substrate 434 is the top substrate of the hybrid sensor shift platform 430 and thus closest to other components of the camera module that may contact the platform 430 during a drop event. The organic material used for the top substrate 434 of the hybrid sensor shift platform 430 is more resilient and flexible than ceramic material, and thus less prone to fracture. Thus, the hybrid sensor shift platform 430 may be more reliable and less prone to fracture in drop events when compared to a ceramic sensor shift platform 330.

Thus, embodiments of the hybrid sensor shift platform 430 reduce the weight of the substrate, reduce unwanted magnetic interaction between the substrate and the VCM magnets, make the substrate more reliable, and may reduce cost of manufacture, while still meeting the overall requirements of the sensor shift platform.

FIG. 4B shows a three-dimensional perspective view of an example organic substrate 434 and ceramic substrate 432A of an example hybrid sensor shift platform 430. The top surfaces of the organic substrate 434 and the ceramic substrate 432A are shown. The top view of the organic substrate 434 shows example non-limiting contact points for attaching various components to the top surface of organic substrate 434, for example SP coils and position sensors as shown in FIG. 2. The top view of the ceramic substrate 432A shows example contact points that correspond to contact points on the bottom surface of the organic substrate 434 (not shown) in a non-limiting pad arrangement. Contact points on the bottom surface of the organic substrate 434 are connected to the corresponding contact points on the top surface of the ceramic substrate 432A via a solder bond process. To take stress off the solder bonds between the organic substrate 434 and the ceramic substrate 432A, the connection between the substrates is reinforced with an under-fill of epoxy that surrounds the solder bonds, thus creating a full interface between the substrates 434 and 432A within the overlap of the two substrates.

Figure 5D:
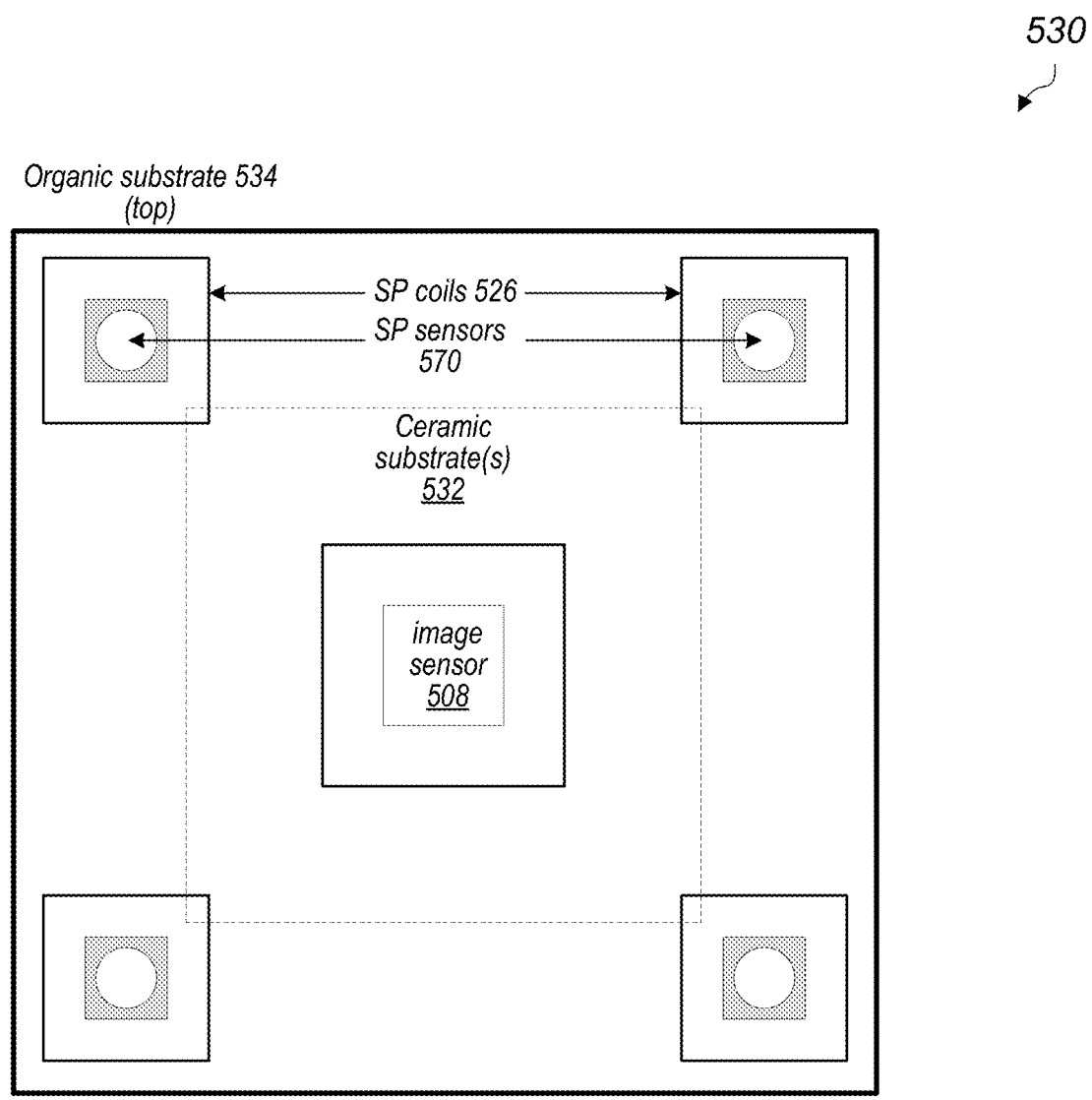

FIGS. 5A through 5D illustrate a simplified example hybrid sensor shift platform 530 composed of an organic block or substrate 534 and one or more ceramic blocks or substrates 532, in accordance with some embodiments. In this example, there is one organic substrate 534 and two ceramic substrates 532A and 532B. FIG. 5A shows a bottom view of an example organic substrate 534, and FIG. 5B shows a top view of an example ceramic substrate 532A. The top view of the ceramic substrate 532A shows contact points that correspond to contact points on the bottom surface of the organic substrate 534 in a non-limiting pad arrangement.

FIG. 5C shows a side view of an example assembled sensor shift platform 530, and shows example SP coils 526 attached to the top surface of the organic substrate 535 and an example image sensor 508 attached to the bottom surface of ceramic substrate 532B. The contact points on the bottom surface of the organic substrate 534 are connected to the corresponding contact points on the top surface of the ceramic substrate 532A with solder bonds 536. To take stress off the solder bonds 536 between the organic substrate 534 and the ceramic substrate 532A, the connection between the substrates is reinforced with an under-fill of epoxy that surrounds the solder bonds 536, thus creating a full interface between the substrates 534 and 532A within the overlap of the two substrates.

The image sensor 508 may be connected to ceramic substrate 532B, for example using a "flip chip" (F/C) process. Flip chip is a method for interconnecting semiconductor devices such as IC chips to external circuitry with solder bumps that have been deposited onto the chip pads. A gold stud bump and gold-to-gold ultrasonic bonding (or, alternatively, gold stud bump and thermo-compression) may be used rather than wafer level gold (or other metal) bumping due to the need to keep the image sensor 508 clean at a sub-micron level to prevent image defects in the camera when functioning. Gold bump to gold bonding works well on gold-plated ceramic due to the ceramic material's mechanical properties.

FIG. 5D shows a top view of the example hybrid sensor shift platform 530 shown in FIG. 5C. Four sensor positioning (SP) coils 526 are located at the corners of the organic substrate 534. SP sensors 570 are located within the coils 526. The dashed square shows the approximate outer edge of the ceramic substrate(s) 532. The area between the dashed square and the dark gray square in the middle of the platform 530 is the overlap between organic substrate 534 and ceramic substrate 532A. The image sensor 508 is attached to ceramic substrate 532B to capture light refracted by the camera lens (not shown) positioned above the platform 530 and image sensor 508.

FIGS. 6A and 6B illustrate solder bond connections between an organic block and a ceramic block of a hybrid sensor shift platform 630, in accordance with some embodiments. To reduce the weight of the sensor shift platform in a camera module, reduce unwanted magnetic interaction between the substrate and VCM magnets of the camera module, and make the substrate more reliable, while still meeting the overall requirements of the sensor shift platform, an organic substrate 634 is connected to a top substrate 632A of one or more ceramic substrates to form a single hybrid sensor shift platform 630.

In some embodiments, organic substrate 634 and ceramic substrate 632A are mechanically and electrically connected by solder bonds 636 at corresponding contact points on the two substrates. The overlap between organic substrate 634 and ceramic substrate 632A is subsequently under-filled with an epoxy material to provide robust mechanical strength/structure and protect the solder bonds. Both organic substrate 634 and ceramic substrate 632A are nickel-plated prior to solder bonding. An electrolytic nickel plating process is used for the ceramic substrate(s). An electroless nickel plating process is used for the organic substrate 634. An electroless nickel plating process does not magnetize the nickel plating as does the electrolytic nickel plating process.

Organic substrate 634 may be a Build-up substrate, a print circuit board, a flexible substrate, or other suitable type of organic substrate composed of an organic material (e.g., resin). In some embodiments, organic substrate 634 may be manufactured using a Semi-additive process (SAP) or Modified semi-additive process (MSAP). Example resin materials that may be used for organic substrate may include, but are not limited to:
HL832 NSFLCA
GHPL 830NSF
GX92 (ABF)
GX62 (ABF)
SR1A The ceramic substrate(s) may be Alumina oxide multi-layer ceramic, Low temperature co-fired ceramic (LTCC), Medium temperature co-fired ceramic (MTCC), or other suitable types of ceramic circuits. In some embodiments, Nickel plating is applied to the organic substrate 634 using an electroless nickel plating process, followed by gold plating. In some embodiments, Nickel plating is applied to the ceramic substrate 632A using an electrolytic nickel plating process, followed by gold plating.

Organic substrate 634 and ceramic substrate 632A are bonded by solder at corresponding contact points. In some embodiments, a tin/silver/copper (Sn/Ag/Cu) solder material may be used. Alternatively, other solder materials may be used. The solder pad on the bottom surface of organic substrate 634 and the solder pad on the top surface of ceramic substrate 632A are the same diameter to form a reliable solder joint. The overlap between organic substrate 634 and ceramic substrate 632A is subsequently under-filled with an epoxy material to provide robust mechanical strength/structure and protect the solder bonds 636.

As shown in FIG. 6B, example layers of a solder bond 636 between organic substrate 634 and ceramic substrate 632A may include, in order from organic substrate 634 to ceramic substrate 632A:
Cu (copper) plating
Ni (nickel) plating
Au (gold) plating
Solder (e.g., Sn/Ag/Cu)
Au (gold) plating
Ni (nickel) plating
Tungsten (W) or Molybdenum (Mo) Metallization Ceramic and ALN Multi-Layer Hybrid Substrate FIGS. 7A through 8B illustrate a ceramic and ALN (Aluminum Nitride) multi-layer hybrid substrate, in accordance with some embodiments. Conventionally, a substrate may consist of a ceramic substrate and an ALN heat slug (sink) without inner circuitry (and thus with low layout density). Embodiments of a ceramic and ALN multi-layer hybrid substrate as illustrated in FIGS. 7A through 8B may provide high thermal conductivity and a higher-density layout than conventional substrates. In embodiments, a ceramic substrate is connected to an ALN multi-layer substrate to form a single substrate. The ceramic substrate is connected to the ALN multi-layer substrate by solder bonds. Solder bonding enables the ceramic substrate and the ALN multi-layer substrate to be electrically connected. Embodiments of the ceramic and ALN multi-layer hybrid substrate may thus provide additional lay-out space in the ALN multi-layer substrate when compared to conventional substrates.

Embodiments may use solder to bond a ceramic substrate to an ALN multi-layer substrate, under-filling the ceramic substrate with an epoxy material that surrounds the solder bonds to provide robust mechanical strength/structure. In some embodiments, both the ceramic substrate and the ALN multi-layer substrate surface are nickel and gold plated prior to solder bonding.

Figure 7A:
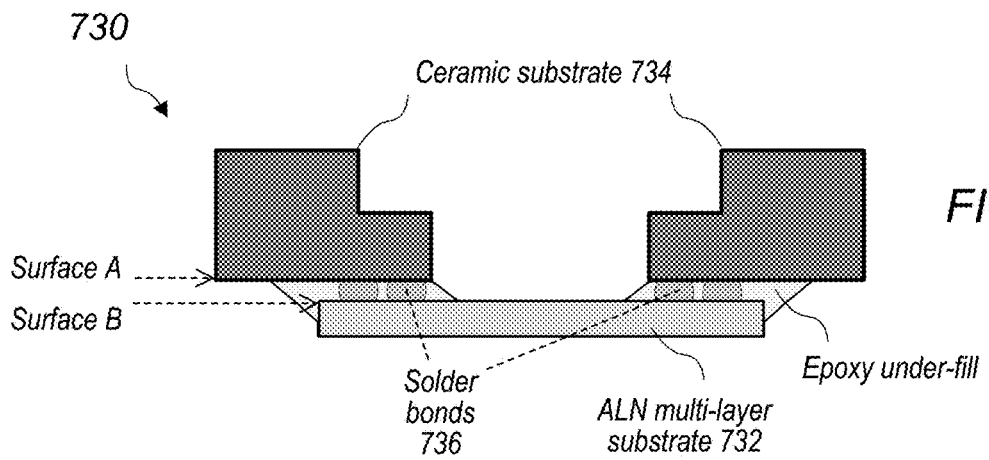
FIGS. 7A through 7C illustrate a hybrid substrate that includes an ALN multi-layer block and one or more ceramic blocks, in accordance with some embodiments.
Figure 7B:
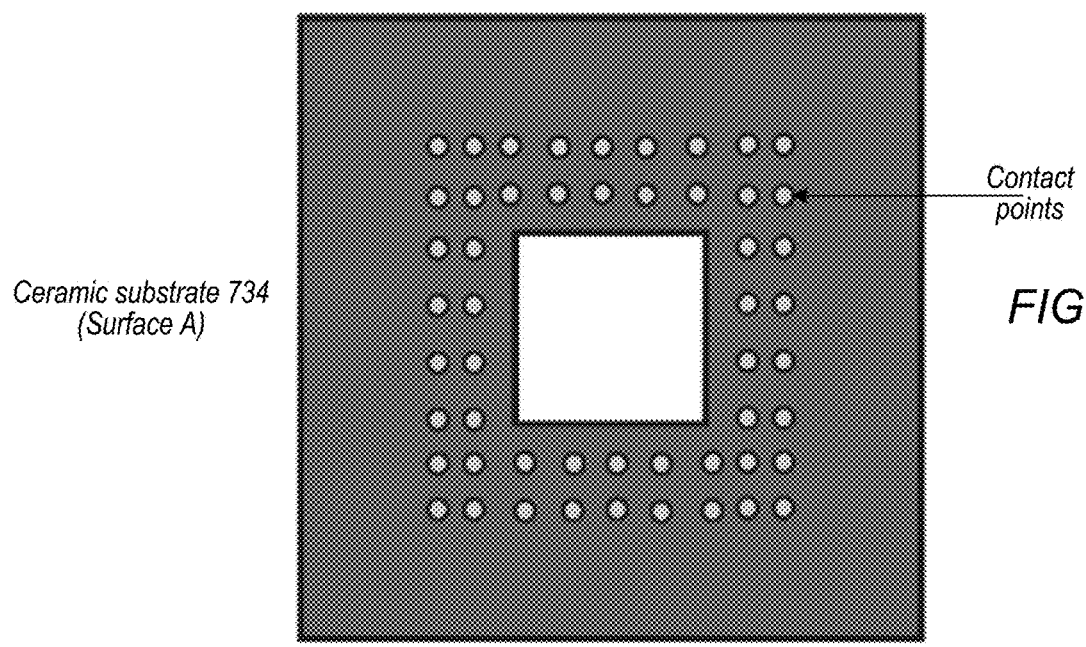
Figure 7C:
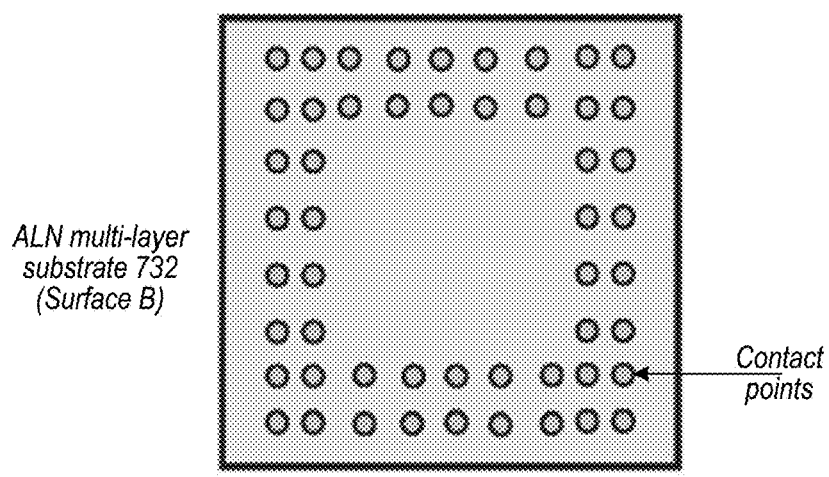

FIGS. 7A through 7C illustrate a hybrid substrate that includes an ALN multi-layer block and one or more ceramic blocks, in accordance with some embodiments. FIG. 7A shows a cutaway side view of an example ceramic and ALN multi-layer hybrid substrate, in accordance with some embodiments. Ceramic substrate 734 may consist of one or more ceramic layers or blocks. The ceramic substrate layer(s) 734 may include Alumina oxide multi-layer ceramic, Low temperature co-fired ceramic (LTCC), Medium temperature co-fired ceramic (MTCC), or other suitable types of ceramic circuits. ALN multi-layer substrate 732 may have internal circuits with co-fire technology. Surface A of ceramic substrate 734 is connected to surface B of ALN multi-layer substrate 732 by solder bonds 736 (e.g., Sn/Ag/Cu or alternative solder bonds). The ceramic substrate 734 is under-filled with an epoxy material that surrounds the solder bonds to provide robust mechanical strength/structure. In some embodiments, both the ceramic substrate 734 surface and the ALN multi-layer substrate 732 surface are nickel and gold (Ni+Au) plated prior to solder bonding.

FIG. 7B shows surface A of an example ceramic substrate 734, and FIG. 7C shows surface B of an example ALN multi-layer substrate 732. Surface A of example ceramic substrate 734 has contact points that correspond to contact points on surface B of example ALN multi-layer substrate 732 in a non-limiting pad arrangement. In some embodiments, the diameter of the solder pad on ceramic substrate 734 and the diameter of the solder pad on the ALN multi-layer substrate 732 are the same to facilitate forming a reliable solder joint.

Figures 8A, 8B:
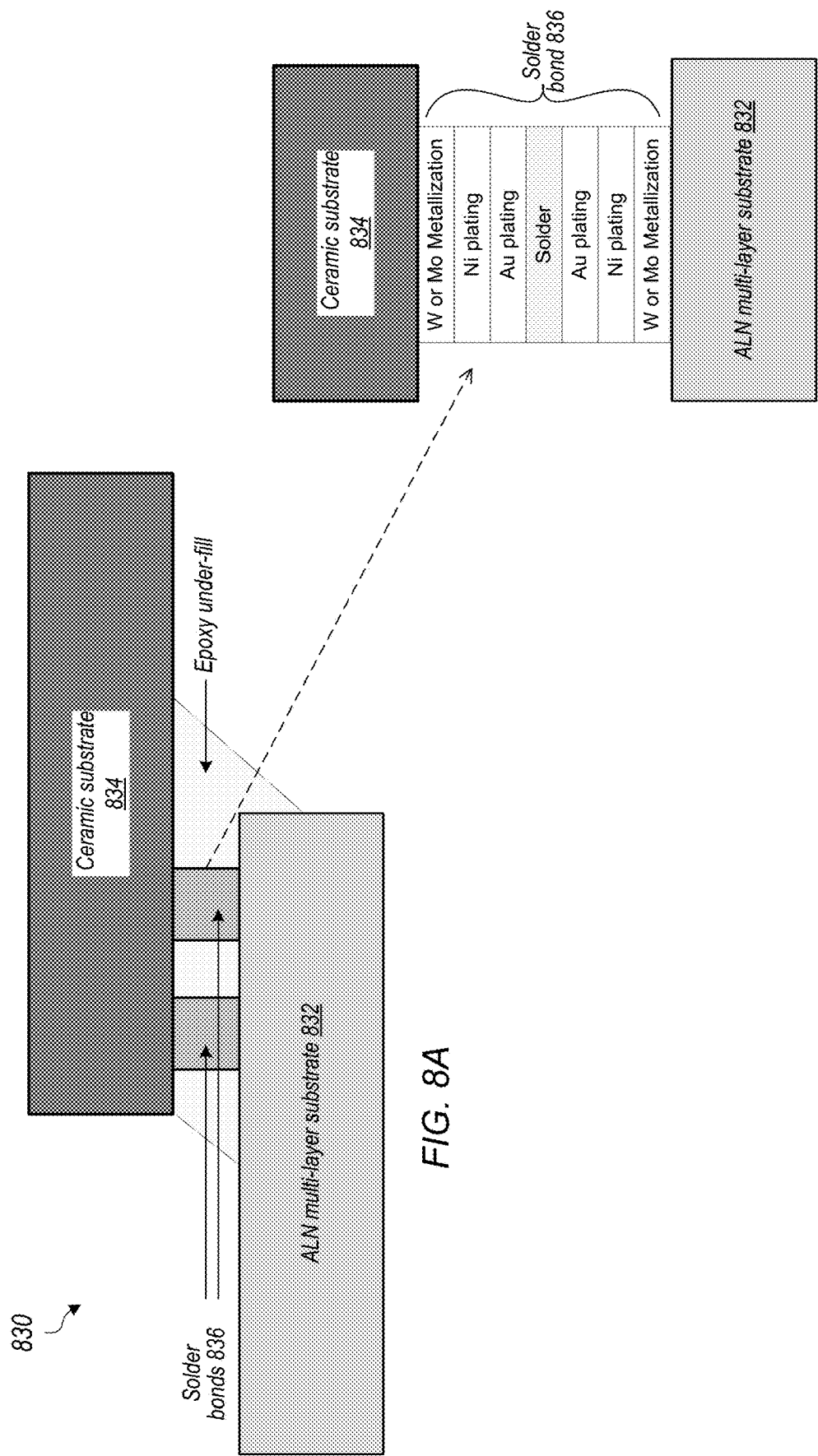
FIGS. 8A and 8B illustrate solder bond connections between an ALN multi-layer block and one or more ceramic blocks, in accordance with some embodiments.

FIGS. 8A and 8B illustrate solder bond connections between an ALN multi-layer block and one or more ceramic blocks, in accordance with some embodiments. As shown in FIG. 8A, a ceramic substrate 834 and an ALN multi-layer substrate 832 are mechanically and electrically connected by solder bonds 836 and under-filled with an epoxy material, thus providing additional lay-out space in the ALN multi-layer substrate 832 when compared to conventional substrates.

In some embodiments, ceramic substrate 834 and ALN multi-layer substrate 832 are mechanically and electrically connected by solder bonds 836 at corresponding contact points on the two substrates, for example as illustrated in FIGS. 7B and 7C. The overlap between ceramic substrate 834 and ALN multi-layer substrate 832 is subsequently under-filled with an epoxy material to provide robust mechanical strength/structure and protect the solder bonds 836. In some embodiments, both ceramic substrate 834 and ALN multi-layer substrate 832 are nickel-plated prior to solder bonding. In some embodiments, an electrolytic nickel plating process may be used for the ceramic substrate(s) 834. In some embodiments, an electroless nickel plating process is used for the ALN multi-layer substrate 832. An electroless nickel plating process does not magnetize the nickel plating as does the electrolytic nickel plating process.

Ceramic substrate 834 may consist of one or more ceramic layers or blocks. The ceramic substrate layer(s) 834 may include Alumina oxide multi-layer ceramic, Low temperature co-fired ceramic (LTCC), Medium temperature co-fired ceramic (MTCC), or other suitable types of ceramic circuits. ALN multi-layer substrate 832 may have internal circuits with co-fire technology. In some embodiments, nickel plating is applied to the ALN multi-layer substrate 832, for example using an electroless nickel plating process, followed by gold plating. In some embodiments, nickel plating is applied to the ceramic substrate 832, for example using an electrolytic nickel plating process, followed by gold plating.

Ceramic substrate 834 and ALN multi-layer substrate 832 are bonded by solder at corresponding contact points. In some embodiments, a tin/silver/copper (Sn/Ag/Cu) solder material may be used. Alternatively, other solder materials may be used. In some embodiments, the solder pad on the bottom surface of ceramic substrate 834 and the solder pad on the top surface of ALN multi-layer substrate 832 are the same diameter to form a reliable solder joint. The overlap between ceramic substrate 834 and ALN multi-layer substrate 832 may be under-filled with an epoxy material to provide robust mechanical strength/structure and protect the solder bonds 836.

Figure 9:
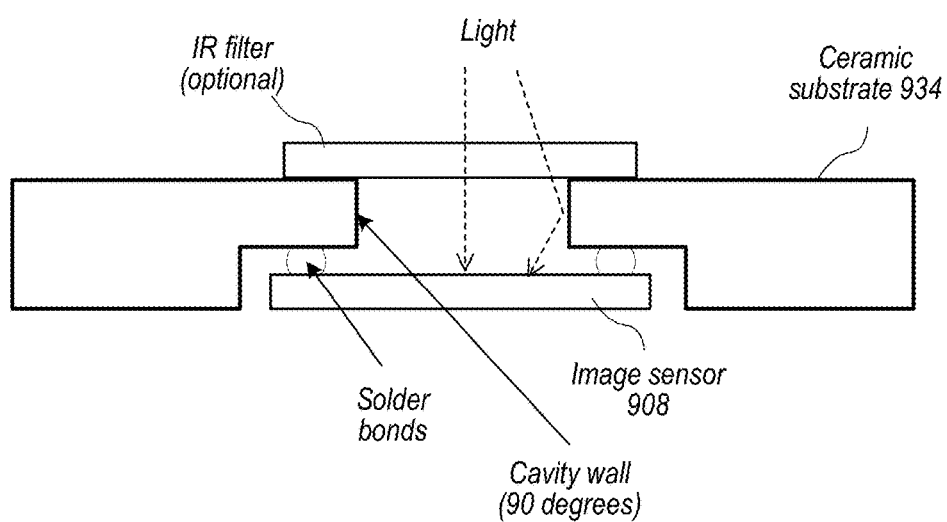
FIG. 9 illustrates a ceramic substrate in which the cavity walls are 90 degrees, in accordance with some embodiments.

As shown in FIG. 8B, example layers of a solder bond 836 between ceramic substrate 834 and ALN multi-layer substrate 832 may include, in order from ceramic substrate 834 to ALN multi-layer substrate 832:

Tungsten (W) or Molybdenum (Mo) Metallization
Ni (nickel) plating
Au (gold) plating
Solder (e.g., Sn/Ag/Cu)
Au (gold) plating
Ni (nickel) plating
Tungsten (W) or Molybdenum (Mo) Metallization Ceramic Substrate with Tapered Cavity FIG. 9 illustrates a ceramic substrate 934 (e.g. a ceramic substrate as illustrated in FIGS. 4A-4B) in which the cavity walls are 90 degrees, in accordance with some embodiments. Ceramic substrate 934 may be connected to an image sensor 908, for example via solder bonds. The ceramic substrate 934 may be Alumina oxide multi-layer ceramic, Low temperature co-fired ceramic (LTCC), Medium temperature co-fired ceramic (MTCC), or other suitable types of ceramic circuits. The ceramic substrate 934 may be under-filled with an epoxy material that surrounds the solder bonds to provide robust mechanical strength/structure. Image sensor 908 may be configured to capture light passing through a lens (not shown) and an IR filter (option) and convert the captured light into image signals. As shown in FIG. 9, the 90 degree walls of the ceramic substrate 934 cavity walls may result in light rays reflecting off the cavity walls and onto the image sensor 908, negatively affecting the quality of images captured by the sensor 908. To address this problem, in some embodiments, the cavity walls of the ceramic substrate may be tapered inward from the top of the substrate to the bottom of the substrate, for example as shown in FIGS. 10A through 10C.

Figure 10A:
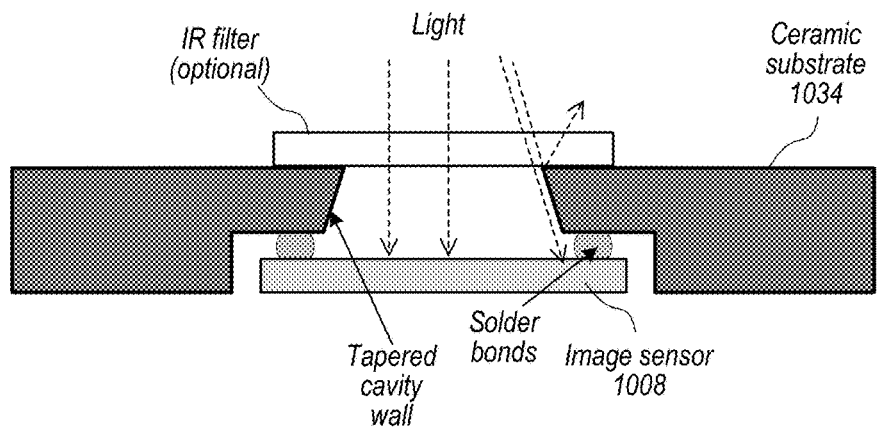
FIGS. 10A through 10C illustrate a ceramic substrate with tapered cavity walls, in accordance with some embodiments.

FIG. 10A shows a ceramic substrate 1034 (e.g. a ceramic substrate as illustrated in FIGS. 4A-4B) with tapered cavity walls, in accordance with some embodiments. FIG. 10B shows the ceramic substrate 1034 of FIG. 10A in more detail. Ceramic substrate 1034 may be connected to an image sensor 1008, for example via solder bonds. The ceramic substrate 1034 may be Alumina oxide multi-layer ceramic, Low temperature co-fired ceramic (LTCC), Medium temperature co-fired ceramic (MTCC), or other suitable types of ceramic circuits. The ceramic substrate 1034 may be under-filled with an epoxy material that surrounds the solder bonds to provide robust mechanical strength/structure. Image sensor 1008 may be configured to capture light passing through a lens (not shown) and an IR filter (option) and convert the captured light into image signals. To prevent light from reflecting off the cavity walls of the ceramic substrate 1034 and onto the image sensor 1008 may be tapered inward from the top of the substrate to the bottom of the substrate. The angle θ of the taper of the cavity walls may, for example, be between 5 and 30 degrees as shown in FIG. 10B.

In some embodiments, the tapered cavity wall may be created by changing punching tool clearance. In some embodiments, a larger punching tool clearance between a cavity upper tool and a cavity lower tool (when compared to conventional punching tool clearance) may be used when the tapered cavity is punched out of the ceramic substrate 1034. Conventionally, clearance between the upper tool and the lower tool is ~10 microns per side. In some embodiments, the clearance between the upper tool and the lower tool may be expanded to 100~200 microns per side to create the tapered cavity wall.

Figure 10B:
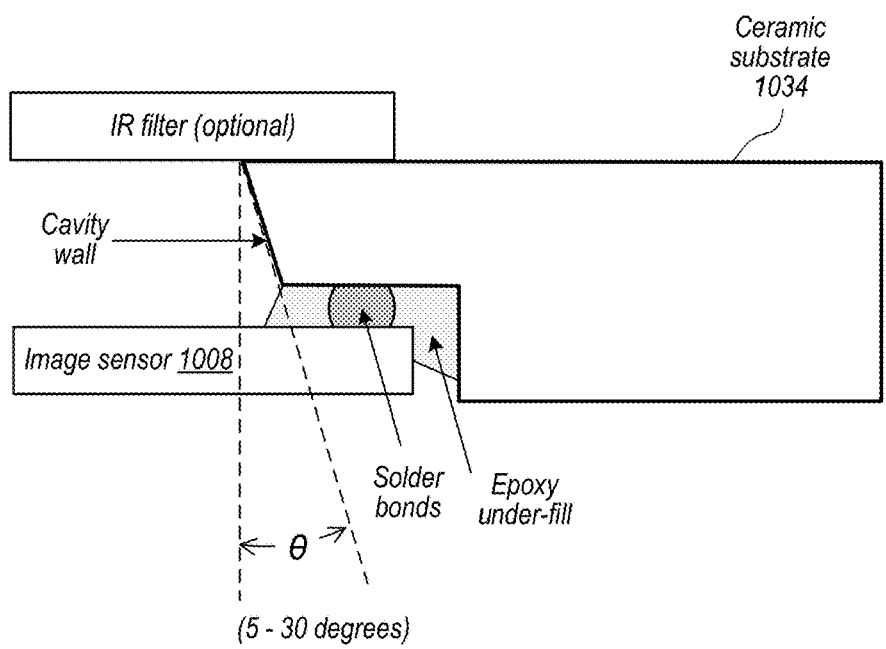
Figure 10C:
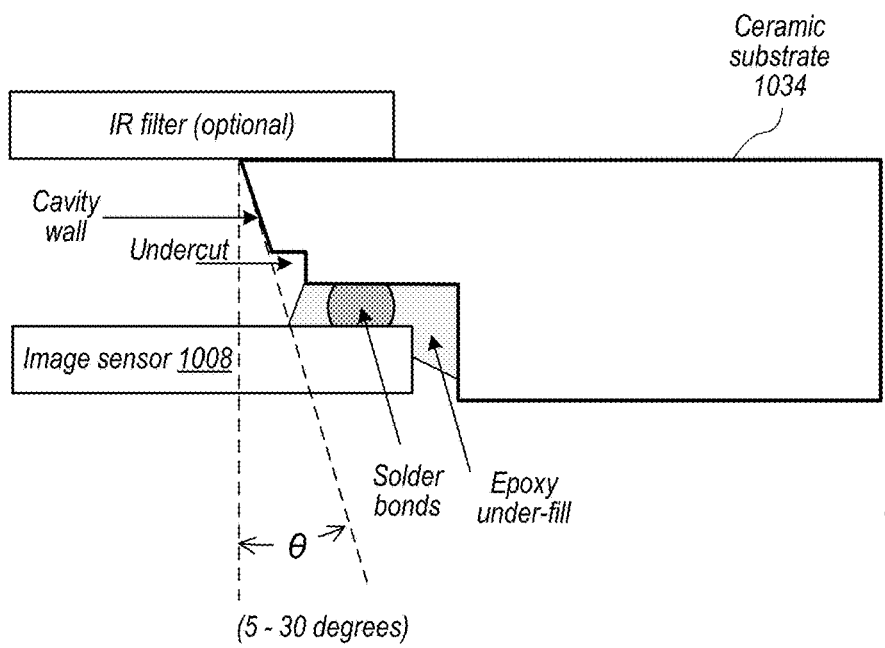

In FIG. 10B, the inner edge of the epoxy under-fill may cause unwanted reflection of light to the image sensor 1008. To prevent this from happening, in some embodiments, one or more layers of the bottom edge in the cavity of the ceramic block (ceramic substrate 1034) may be undercut, as shown in FIG. 10C. This reduces the progress of the under-fill epoxy on to the image sensor substrate so that it may not cause light reflection onto the sensor 1008.

Organic Substrate with Solder Resist Coating

In a sensor shift platform, it is important to protect the surface of the image sensor from dust and other particles. There is a potential for particles from the substrates of the sensor shift platform to land on the surface of the sensor. Thus, there is a need for the substrates to be particle-free. The ceramic substrate typically does not have a particle issue on the cavity wall. However, an organic substrate may pose a particle problem in a sensor shift platform. Thus, in some embodiments, a solder resist material may be used to cover at least the cavity wall of the organic substrate to prevent particles falling into the image sensor area. In some embodiments, at least the cavity wall of the organic substrate is over-coated with solder resist prior to joining the ceramic and organic substrates with solder bonds and under-fill epoxy.

Figure 11A:
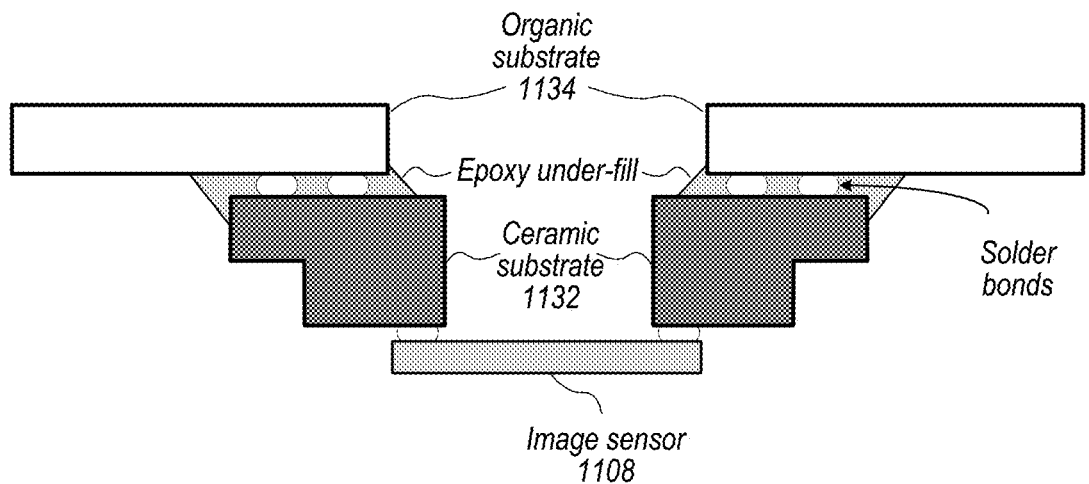
FIGS. 11A and 11B illustrate solder resist coating on an organic substrate, in accordance with some embodiments.
Figure 11B:
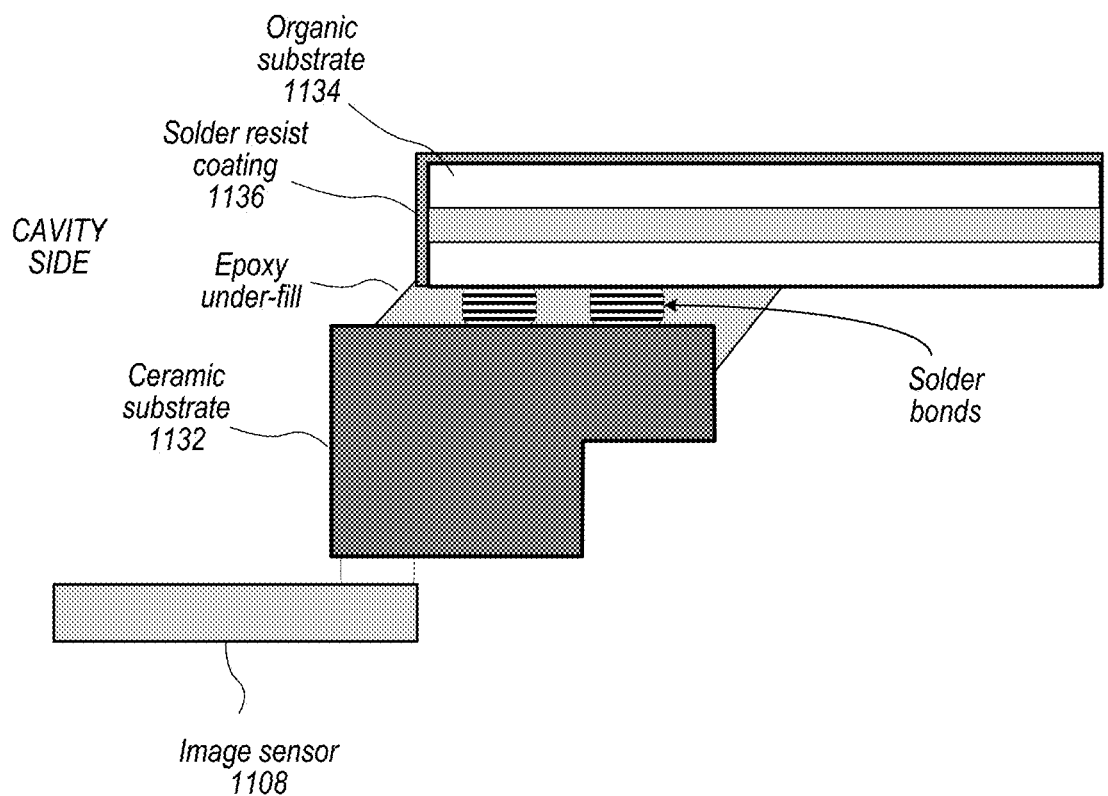

FIGS. 11A and 11B illustrate solder resist coating on an organic substrate, in accordance with some embodiments. FIG. 11A shows a sensor shift platform that includes an image sensor 1108, ceramic substrate 1132 that may include one or more blocks, and organic substrate 1134. Ceramic substrate 1132 and organic substrate 1134 are connected by solder bonds, and the overlap between the substrates may be filled with an epoxy material. Organic substrate 1134 may, for example, be a built-up substrate, a print circuit board, a flexible substrate, or in general any type of organic substrate. Ceramic substrate 1132 may, for example, be an alumina oxide multi-layer ceramic substrate, LTCC, MTCC, or in general any type of ceramic substrate. FIG. 11B shows a portion of the sensor shift platform of FIG. 11A in more detail. As shown in FIG. 11B, at least the cavity wall of organic substrate 1134 has been coated with a solder resist material 1136. Various types of solder resist material may be used.

Example Computing Device

Figure 12:
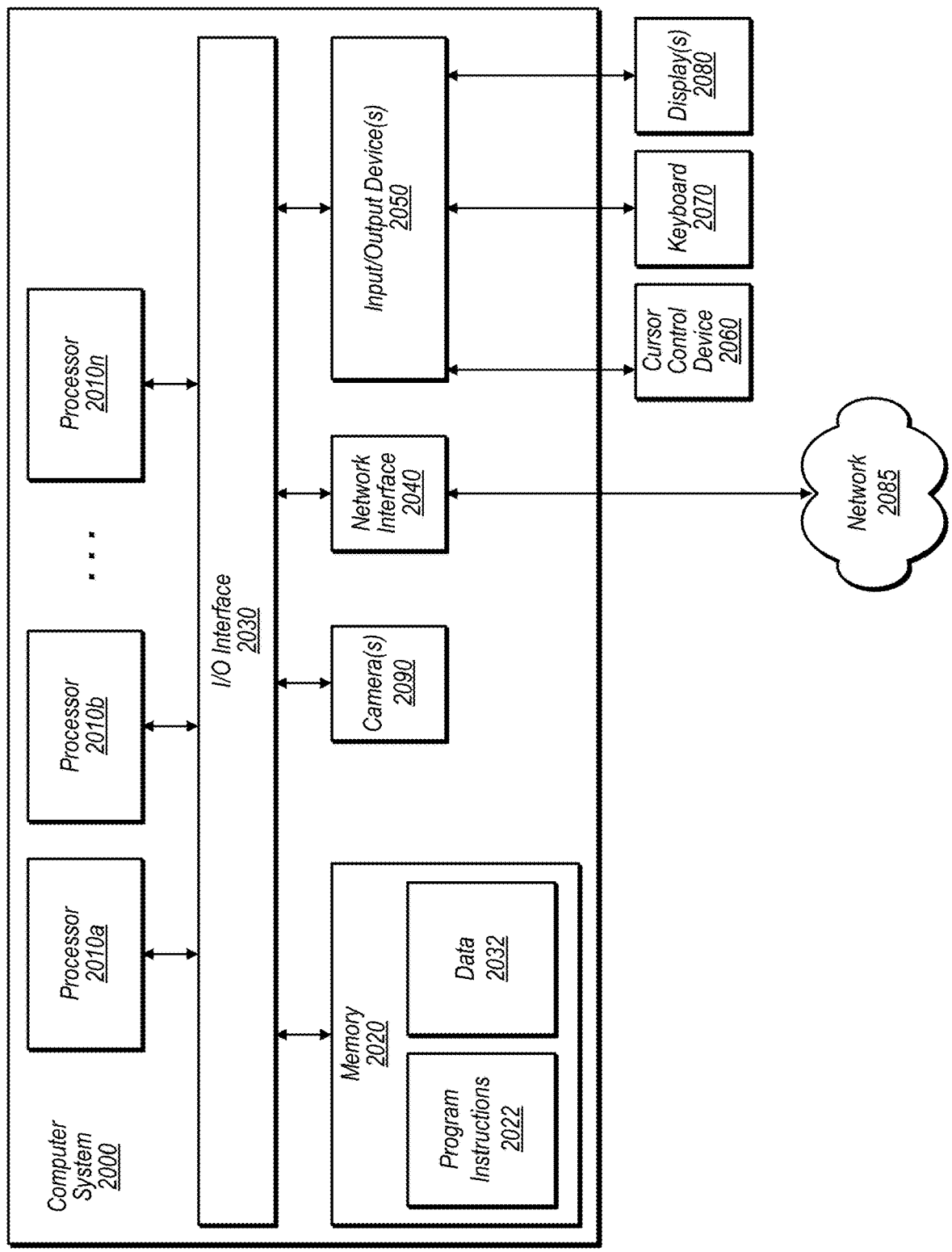
FIG. 12 illustrates an example computer system that may include a camera module, in accordance with some embodiments.

FIG. 12 illustrates an example computing device, referred to as computer system 2000, that may include or host embodiments of a camera module as illustrated in FIGS. 1A through 10C. In addition, computer system 2000 may implement methods for controlling operations of the camera module and/or for performing image processing of images captured with the camera module. In different embodiments, computer system 2000 may be any of various types of devices, including, but not limited to, a personal computer system, desktop computer, laptop, notebook, tablet or pad device, slate, or netbook computer, mainframe computer system, handheld computer, workstation, network computer, a camera, a set top box, a mobile device, a wireless phone, a smartphone, a consumer device, video game console, handheld video game device, application server, storage device, a television, a video recording device, a peripheral device such as a switch, modem, router, or in general any type of computing or electronic device.

In the illustrated embodiment, computer system 2000 includes one or more processors 2010 coupled to a system memory 2020 via an input/output (I/O) interface 2030. Computer system 2000 further includes a network interface 2040 coupled to I/O interface 2030, and one or more input/output devices 2050, such as cursor control device 2060, keyboard 2070, and display(s) 2080. Computer system 2000 may also include one or more cameras 2090, for example at least one camera module that includes a hybrid sensor shift platform as described above with respect to FIGS. 4A through 10C.

In various embodiments, computer system 2000 may be a uniprocessor system including one processor 2010, or a multiprocessor system including several processors 2010 (e.g., two, four, eight, or another suitable number). Processors 2010 may be any suitable processor capable of executing instructions. For example, in various embodiments processors 2010 may be general-purpose or embedded processors implementing any of a variety of instruction set architectures (ISAs), such as the x86, PowerPC, SPARC, or MIPS ISAs, or any other suitable ISA. In multiprocessor systems, each of processors 2010 may commonly, but not necessarily, implement the same ISA.

System memory 2020 may be configured to store program instructions 2022 and/or data 2032 accessible by processor 2010. In various embodiments, system memory 2020 may be implemented using any suitable memory technology, such as static random access memory (SRAM), synchronous dynamic RAM (SDRAM), nonvolatile/Flash-type memory, or any other type of memory. In the illustrated embodiment, program instructions 2022 may be configured to implement various interfaces, methods and/or data for controlling operations of camera(s) 2090 and for capturing and processing images with integrated camera(s) 2090 or other methods or data, for example interfaces and methods for capturing, displaying, processing, and storing images captured with camera(s) 2090. In some embodiments, program instructions and/or data may be received, sent or stored upon different types of computer-accessible media or on similar media separate from system memory 2020 or computer system 2000.

In one embodiment, I/O interface 2030 may be configured to coordinate I/O traffic between processor 2010, system memory 2020, and any peripheral devices in the device, including network interface 2040 or other peripheral interfaces, such as input/output devices 2050. In some embodiments, I/O interface 2030 may perform any necessary protocol, timing or other data transformations to convert data signals from one component (e.g., system memory 2020) into a format suitable for use by another component (e.g., processor 2010). In some embodiments, I/O interface 2030 may include support for devices attached through various types of peripheral buses, such as a variant of the Peripheral Component Interconnect (PCI) bus standard or the Universal Serial Bus (USB) standard, for example. In some embodiments, the function of I/O interface 2030 may be split into two or more separate components, such as a north bridge and a south bridge, for example. Also, in some embodiments some or all of the functionality of I/O interface 2030, such as an interface to system memory 2020, may be incorporated directly into processor 2010.

Network interface 2040 may be configured to allow data to be exchanged between computer system 2000 and other devices attached to a network 2085 (e.g., carrier or agent devices) or between nodes of computer system 2000. Network 2085 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 2040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 2050 may, in some embodiments, include one or more display terminals, keyboards, keypads, touchpads, scanning devices, voice or optical recognition devices, or any other devices suitable for entering or accessing data by computer system 2000. Multiple input/output devices 2050 may be present in computer system 2000 or may be distributed on various nodes of computer system 2000. In some embodiments, similar input/output devices may be separate from computer system 2000 and may interact with one or more nodes of computer system 2000 through a wired or wireless connection, such as over network interface 2040.

As shown in FIG. 12, memory 2020 may include program instructions 2022, which may be processor-executable to implement any element or action to support integrated camera(s) 2090, including but not limited to image processing software and interface software for controlling camera(s) 2090. In some embodiments, images captured by camera(s) 2090 may be stored to memory 2020. In addition, metadata for images captured by camera(s) 2090 may be stored to memory 2020.

Those skilled in the art will appreciate that computer system 2000 is merely illustrative and is not intended to limit the scope of embodiments. In particular, the computer system and devices may include any combination of hardware or software that can perform the indicated functions, including computers, network devices, Internet appliances, PDAs, wireless phones, pagers, video or still cameras, etc. Computer system 2000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system 2000 via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 2000 may be transmitted to computer system 2000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A sensor shift platform, comprising:
an organic substrate composed of a resin material; and
a ceramic substrate composed of a ceramic material; and
an image sensor coupled to the ceramic substrate such that the image sensor moves together with the sensor shift platform;
wherein the organic substrate is connected to the ceramic substrate by solder bonds at corresponding contact points; and
wherein the sensor shift platform is configured to move in a plurality of directions within a camera module under control of a voice coil motor (VCM) actuator.

2. The sensor shift platform as recited in claim 1, wherein an overlapped region of the organic substrate and the ceramic substrate is under-filled with an epoxy material to protect the solder bonds.

3. The sensor shift platform as recited in claim 1, further comprising one or more flexures that mechanically and electrically connect the sensor shift platform to a static platform of the camera module, wherein the flexures provide compliance for movement in the plurality of directions.

4. The sensor shift platform as recited in claim 1, wherein the organic substrate is a top substrate of the sensor shift platform and closer to magnets of the VCM actuator than the ceramic substrate.

5. The sensor shift platform as recited in claim 4, further comprising two or more sensor positioning (SP) coils on a top surface of the organic substrate of the sensor shift platform, wherein, to move the image sensor in a plurality of directions, the VCM actuator is configured to cause the SP coils to magnetically interact with the VCM actuator magnets.

6. The sensor shift platform as recited in claim 1, wherein the organic substrate and the ceramic substrate are nickel-plated prior to solder bonding, wherein an electrolytic nickel plating process is used for the ceramic substrate, and wherein an electroless nickel plating process is used for the organic substrate.

7. The sensor shift platform as recited in claim 6, wherein the organic substrate and the ceramic substrate are gold-plated after nickel-plating.

8. The sensor shift platform as recited in claim 1, wherein the ceramic substrate includes a cavity through which light passes to reach the image sensor, and wherein walls of the cavity are tapered to prevent light from reflecting off the cavity walls onto the image sensor.

9. The sensor shift platform as recited in claim 8, wherein the ceramic substrate is connected to the image sensor by solder bonds at corresponding contact points, wherein an overlapped region of the ceramic substrate and the image sensor is under-filled with an epoxy material to protect the solder bonds, and wherein the cavity walls of the ceramic substrate are undercut to reduce progress of the under-fill epoxy on to the image sensor.

10. The sensor shift platform as recited in claim 1, further comprising an ALN (Aluminum Nitride) multi-layer substrate connected to the ceramic substrate by solder bonds, wherein an overlapped region of the ceramic substrate and the ALN multi-layer substrate is under-filled with an epoxy material to protect the solder bonds.

11. A voice coil motor (VCM) actuator, comprising:
two or more magnets;
two or more coils;
a sensor shift platform coupled to an image sensor of a camera such that the image sensor moves together with the sensor shift platform;
a static platform that is static relative to the sensor shift platform;
wherein the VCM actuator is configured to move the sensor shift platform in a plurality of directions; and wherein the sensor shift platform comprises:
an organic substrate composed of a resin material; and
a ceramic substrate composed of a ceramic material, wherein the image sensor is coupled to the ceramic substrate;
wherein the organic substrate is connected to the ceramic substrate by solder bonds at corresponding contact points.

12. The VCM actuator of claim 11, wherein, to move the sensor shift platform in a plurality of directions, the magnets and coils are configured to magnetically interact to move the sensor shift platform in a plurality of directions orthogonal to an optical axis defined by a lens of a camera.

13. The VCM actuator as recited in claim 11, wherein an overlapped region of the organic substrate and the ceramic substrate is under-filled with an epoxy material to protect the solder bonds.

14. The VCM actuator as recited in claim 11, further comprising one or more flexures that mechanically and electrically connect the sensor shift platform to the static platform of the camera, wherein the flexures provide compliance for movement in the plurality of directions.

15. The VCM actuator as recited in claim 11, wherein the organic substrate is a top substrate of the sensor shift platform and closer to the magnets than the ceramic substrate, wherein the two or more coils include one or more sensor positioning (SP) coils on a top surface of the organic substrate of the sensor shift platform, and wherein, to move the image sensor in a plurality of directions orthogonal to the optical axis, the VCM actuator is configured to cause the SP coils to magnetically interact with the VCM actuator magnets.

16. The VCM actuator as recited in claim 11, wherein the organic substrate and the ceramic substrate are nickel-plated prior to solder bonding, wherein an electrolytic nickel plating process is used for the ceramic substrate, wherein an electroless nickel plating process is used for the organic substrate, and wherein the organic substrate and the ceramic substrate are gold-plated after nickel-plating.

17. A camera, comprising:
a lens that defines an optical axis;
an image sensor configured to capture light passing through the lens and convert the captured light into image signals;
a voice coil motor (VCM) actuator, including:
two or more magnets;
two or more coils; and
a sensor shift platform coupled to the image sensor such that the image sensor moves together with the sensor shift platform;
wherein the VCM actuator is configured to move the sensor shift platform in a plurality of directions orthogonal to the optical axis; and
wherein the sensor shift platform comprises:
an organic substrate composed of a resin material; and
a ceramic substrate composed of a ceramic material, wherein the image sensor is coupled to the ceramic substrate;
wherein the organic substrate is connected to the ceramic substrate by solder bonds at corresponding contact points.

18. The camera as recited in claim 17, wherein an overlapped region of the organic substrate and the ceramic substrate is under-filled with an epoxy material to protect the solder bonds.

19. The camera as recited in claim 17, further comprising one or more flexures that mechanically and electrically connect the sensor shift platform to a static platform of the camera, wherein the flexures provide compliance for movement in the plurality of directions orthogonal to the optical axis and along the optical axis.

20. The camera as recited in claim 17, wherein the organic substrate is a top substrate of the sensor shift platform and closer to the VCM actuator magnets than the ceramic substrate, wherein the two or more coils include one or more sensor positioning (SP) coils on a top surface of the organic substrate of the sensor shift platform, and wherein, to move the image sensor in a plurality of directions orthogonal to the optical axis, the VCM actuator is configured to cause the SP coils to magnetically interact with the VCM actuator magnets.

21. The camera as recited in claim 17, wherein the organic substrate and the ceramic substrate are nickel-plated prior to solder bonding, wherein an electrolytic nickel plating process is used for the ceramic substrate, and wherein an electroless nickel plating process is used for the organic substrate, and wherein the organic substrate and the ceramic substrate are gold-plated after nickel-plating.

22. The camera as recited in claim 17, wherein the camera is a component in a device comprising:
a display; and
one or more processors configured to:
cause the VCM actuator to move the sensor shift platform in a plurality of directions orthogonal to the optical axis; and
cause the display to present an image based at least in part on one or more of the image signals from the image sensor.

* * * * *